United States Patent [19]

Yamada

[11] Patent Number: 5,615,154
[45] Date of Patent: Mar. 25, 1997

[54] FLASH MEMORY DEVICE HAVING ERASE VERIFICATION

[75] Inventor: Shigekazu Yamada, Kawasaki, Japan

[73] Assignee: Fujitsu Limited, Kawasaki, Japan

[21] Appl. No.: 518,688

[22] Filed: Aug. 24, 1995

[30] Foreign Application Priority Data

Aug. 31, 1994 [JP] Japan .................................. 6-207102

[51] Int. Cl.⁶ .................................................. G11C 11/34
[52] U.S. Cl. .............................. 365/185.22; 365/185.29; 365/218
[58] Field of Search ......................... 365/185.22, 185.29, 365/218, 185.3, 185.25

[56] References Cited

U.S. PATENT DOCUMENTS 5,428,570  6/1995  Iwahashi ........................ 365/185.22
5,463,587  10/1995  Maruyama ...................... 365/185.22

*Primary Examiner*—David C. Nelms
*Assistant Examiner*—F. Niranjan
*Attorney, Agent, or Firm*—Armstrong, Westerman, Hattori, McLeland & Naughton

[57] ABSTRACT

At the time of erasing, the erase verification is not effected but the erase voltage is repetitively applied to the source of a memory cell until it is so judged that the erase current $I_A$ flowing into the source of the memory is smaller than the reference current $I_B$ and when it is judged that the erase current $I_A$ flowing into the source of the memory cell is smaller than the reference current $I_B$, application of the erase pulse to the source of the memory cell and the erase verification are repetitively effected. As a result, in the flash memory device, it is possible to decrease the number of times of erase verification and reduce the time required for the erasing.

15 Claims, 28 Drawing Sheets

FLASH MEMORY DEVICE HAVING ERASE VERIFICATION

BACKGROUND OF THE INVENTION

1. Field of the Invention

The present invention relates to an electrically erasable programmable read-only memory device, or a so-called flash memory device.

2. Description of the Related Art

FIG. 45 is a diagram which schematically illustrates cross-sectional structure of a memory cell in a flash memory, wherein reference numeral 1 denotes a p-type silicon substrate, 2 denotes a drain made up of an n-type diffused layer, 3 denotes a source made up of an n-type diffused layer, 4 denotes a floating gate of polysilicon and reference numeral 5 denotes a control gate of polysilicon.

Data is written into this memory cell by, for example, applying a control gate voltage Vcg=12 [V], a source voltage Vs=0 [V], and applying a write voltage (write pulse) of 6 [V] to the drain 2, so that hot electrons generated near the drain 2 in the p-type silicon substrate 1 are injected into the floating gate 4 as indicated by arrow 6.

In order to read the data, on the other hand, a control gate voltage Vcg=5 [V], a source voltage Vs=0 [V] and a drain voltage Vd=1 [V] are applied, whether a current flows into the drain 2 or not is judged, and thus whether the stored data is "1" or "0" is judged.

In order to erase the data, furthermore, a control gate voltage Vcg=0 [V] is applied, the drain 2 is left open, an erase voltage (erase pulse) of 12 [V] is applied to the source 3, and electrons are drawn from the floating gate 4 into the source 3 as indicated by arrow 7.

Here, the erasing is batchwisely effected for all the memory cells in the selected block or chip, and is carried out in the conventional flash memory according to a procedure as shown in FIG. 46.

First, VPPH=12.0 [V] is applied to a VPP (write/erase voltage) terminal which is one of the external terminals.

Next, an erase setup instruction and an erase instruction are consecutively input, whereby a counted value N of a loop counter is set to N=1. Then, the erase voltage is applied to the source of the memory cell for a period of, for example, 10 ms to effect a first time of erasing and, then, erasing is verified.

When there exist non-erased memory cells as a result of verifying the erasure, the value N is increased to N=N+1 within a range in which the counted value N of the loop counter does not exceed a maximum counted value Ne, e.g., 3000 times, and the application of erase voltage to the source of the memory cell and the verification of erasure are repeated.

When there exist non-erased memory cells as a result of verifying the erasure and when the counted value N of the loop counter comes into agreement with a maximum counted value Ne, an error processing is carried out.

When there no non-erased memory cells exist as a result of verification of erasure, the VPP terminal assumes a voltage of, for example, VPPL=0 to 0.65 [V], and the erase mode is finished.

FIG. 47 shows erase characteristics of a memory cell, wherein the abscissa represents the total time of applying the erase voltage and the ordinate represents the control gate voltage.

In FIG. 47, when the control gate voltage is larger than a value represented by a solid line 9, the memory cell is recognized to be turned on and when the control gate voltage is smaller than a value represented by the solid line 9, the memory cell is recognized to be turned off.

As will be obvious from FIG. 47, the data is not completely erased unless the total time of applying the erase voltage becomes longer than a predetermined period of time. In the conventional flash memory, however, the erasure is necessarily verified after the erase voltage is applied to the source of the memory cell from the start of the erasing operation, i.e., even during a period in which the erasure does not need to be substantially verified. Accordingly, extended periods of time are required before the erasing is finished.

SUMMARY OF THE INVENTION

An object of the present invention is to provide a flash memory which enables the number of times of verifying the erasure to be decreased and the time required for the erasing to be shortened.

According to the present invention, there is provided a flash memory device equipped with a control circuit which controls the erase operation and the erase verification operation in a manner that, in the erase mode, the erase verification is not effected but an erase voltage is repetitively applied to the source of a memory cell until the erasing proceeds to a predetermined extent and after the erasing has proceeded to the predetermined extent, the application of erase voltage to the source of the memory cell and the erase verification are repetitively effected.

According to the present invention, the erase verification is not effected in the erase mode until the erasing proceeds to a predetermined extent and after the erasing has proceeded to the predetermined extent, the erase verification is effected, making it possible to decrease the number of times of erase verification and to shorten the time required for the erasing.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

A first embodiment and a second embodiment of the present invention will now be described with reference to FIGS. 1 to 44.

First Embodiment—FIGS. 1 to 41

Figure 1:
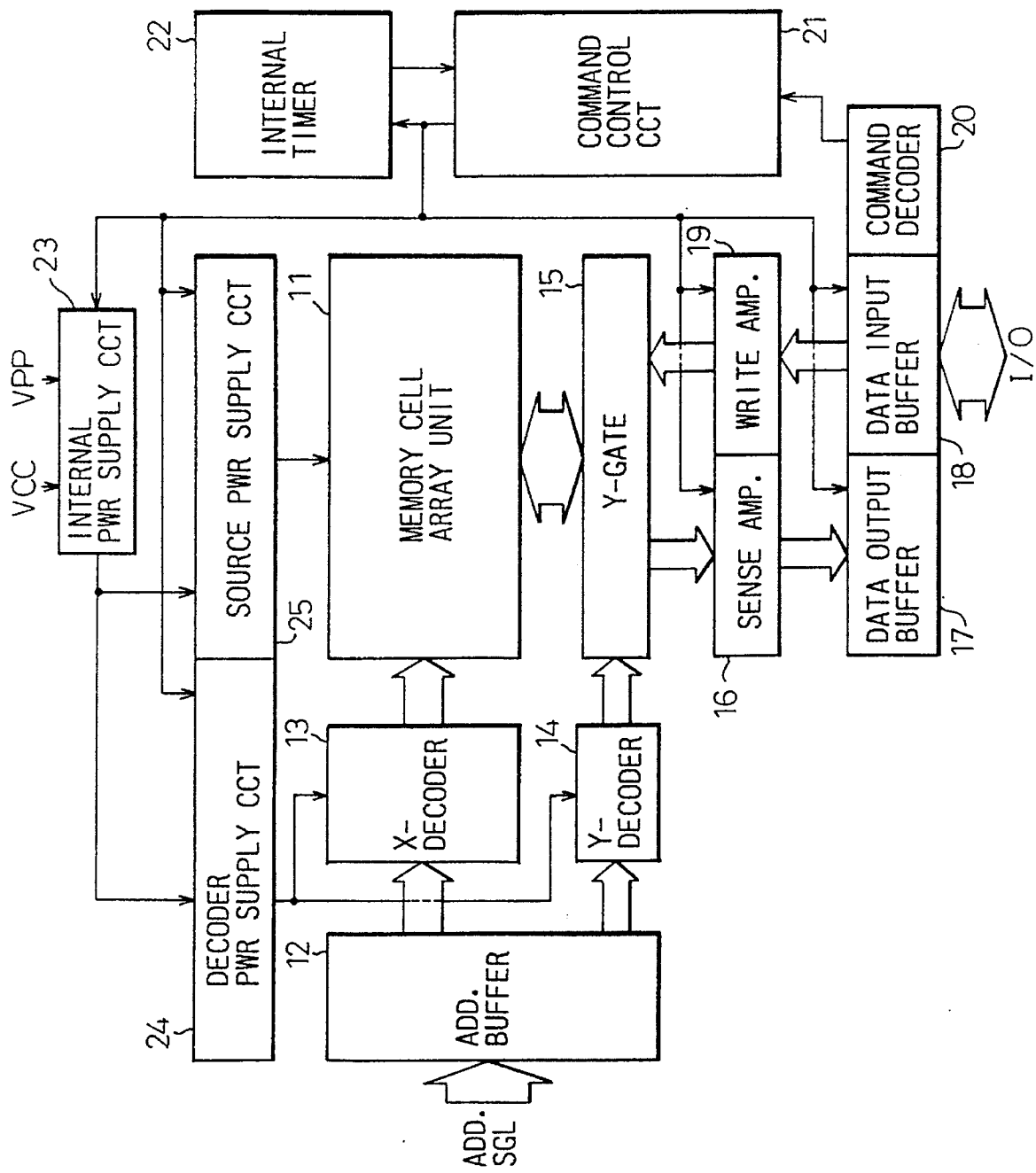
FIG. 1 is a circuit diagram illustrating major portions of a first embodiment of the present invention.
Figure 45:
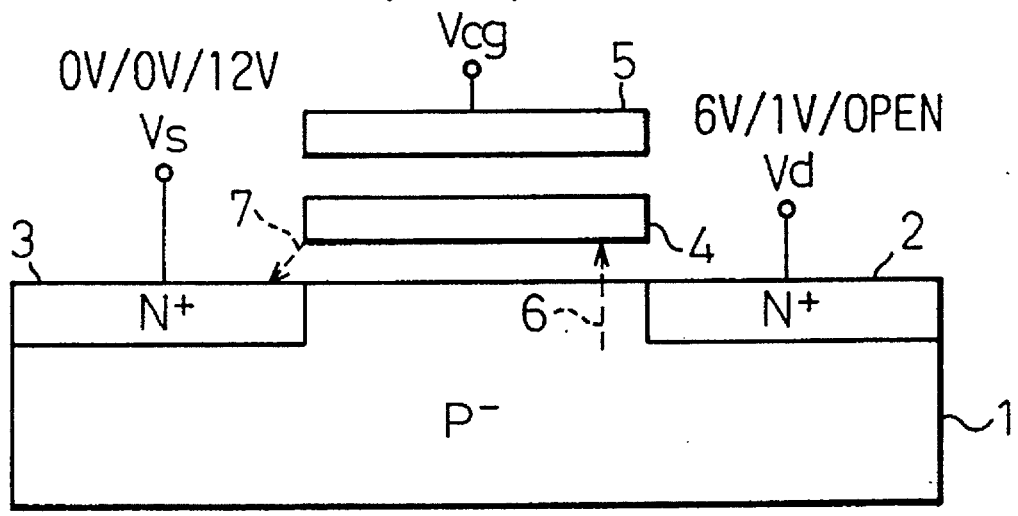
FIG. 45 is a sectional view which schematically illustrates in cross section the structure of a memory cell of a flash memory.
Figure 46:
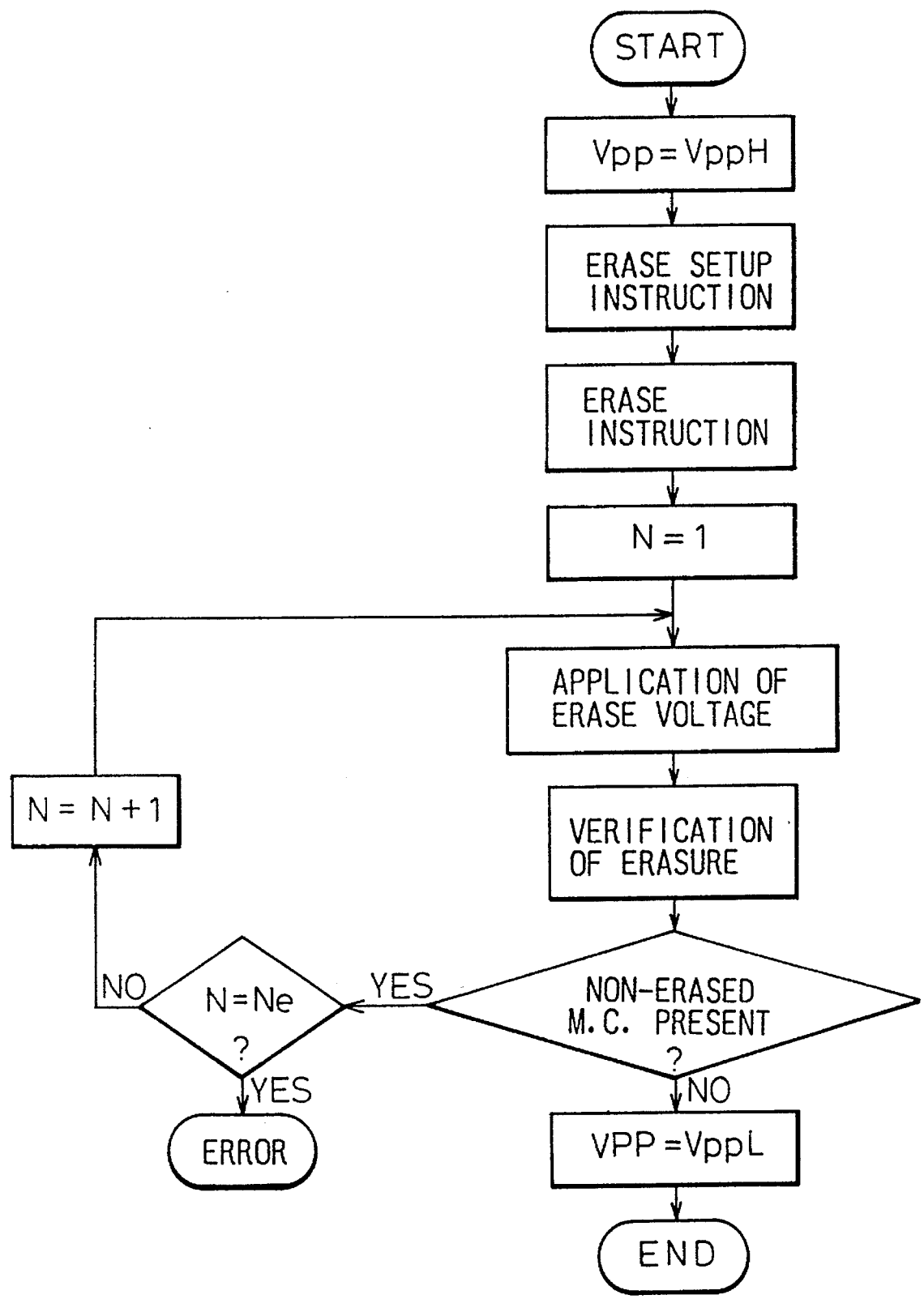
FIG. 46 is a flow chart illustrating the procedure for erasing a conventional flash memory.
Figure 47:
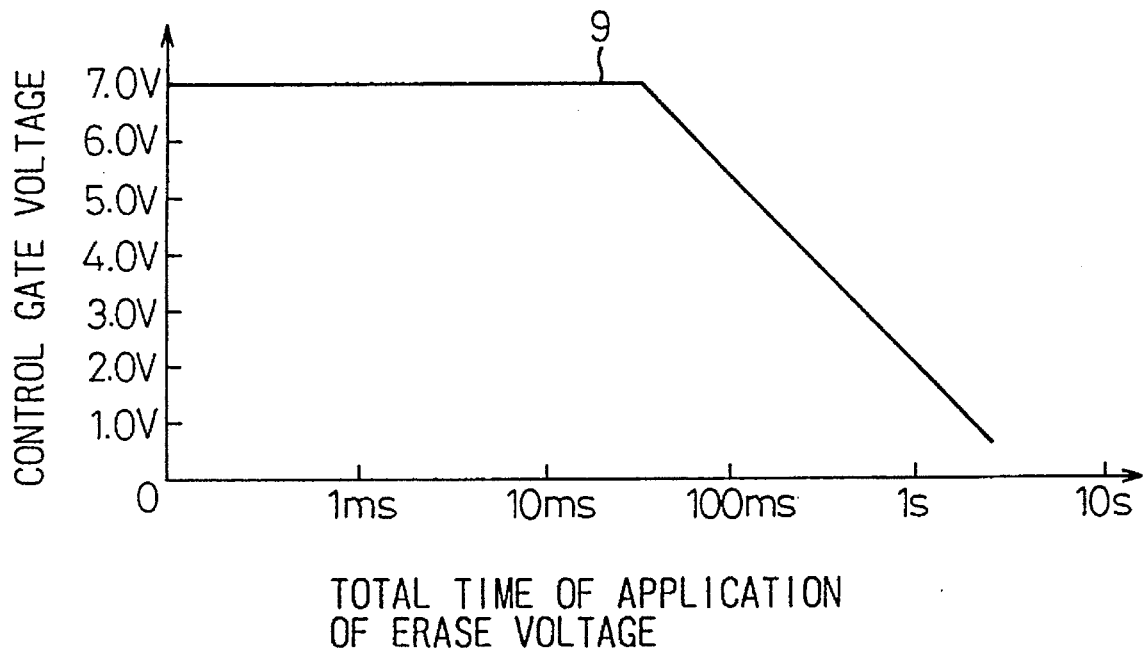
FIG. 47 is a diagram illustrating erase characteristics of a memory cell.

FIG. 1 is a circuit diagram illustrating the major portions of a first embodiment of the present invention, wherein reference numeral 11 denotes a memory cell array unit in which are arranged the memory cells shown in FIG. 45.

Reference numeral 12 denotes an address buffer for receiving address signals fed from an external unit, and 13 denotes an X-decoder for selecting a line by decoding an X-address signal among the address signals received by the address buffer 12.

Reference numeral 14 denotes a Y-decoder for outputting a column select signal by decoding a Y-address signal among the address signals received by the address buffer 12, and 15 denotes a Y-gate for selecting a column based on the column select signal output from the Y-decoder 14.

Reference numeral 16 denotes a sense amplifier for amplifying the data read out from the memory cell array unit 11, and 17 denotes a data output buffer for latching the data amplified by the sense amplifier 16 and for outputting it to an external unit.

Reference numeral 18 denotes a data input buffer for receiving input data, and 19 denotes a write amplifier that is used for writing the input data into the memory cell array unit 11.

Reference numeral 20 denotes a command decoder for decoding a command supplied from an external unit, 21 denotes a command control circuit for controlling internal circuits relying upon a decode signal output from the command decoder 20, and 22 denotes an internal timer.

Reference numeral 23 denotes an internal power supply circuit for receiving a power supply voltage Vcc and write/erase power supply voltage Vpp supplied from an external unit, 24 denotes a decoder power supply circuit for feeding a necessary voltage to the X-decoder 13 and the Y-decoder 14, and reference numeral 25 denotes a source power supply circuit for feeding a necessary voltage to the source of a memory cell in the memory cell array unit 11.

Figure 2:
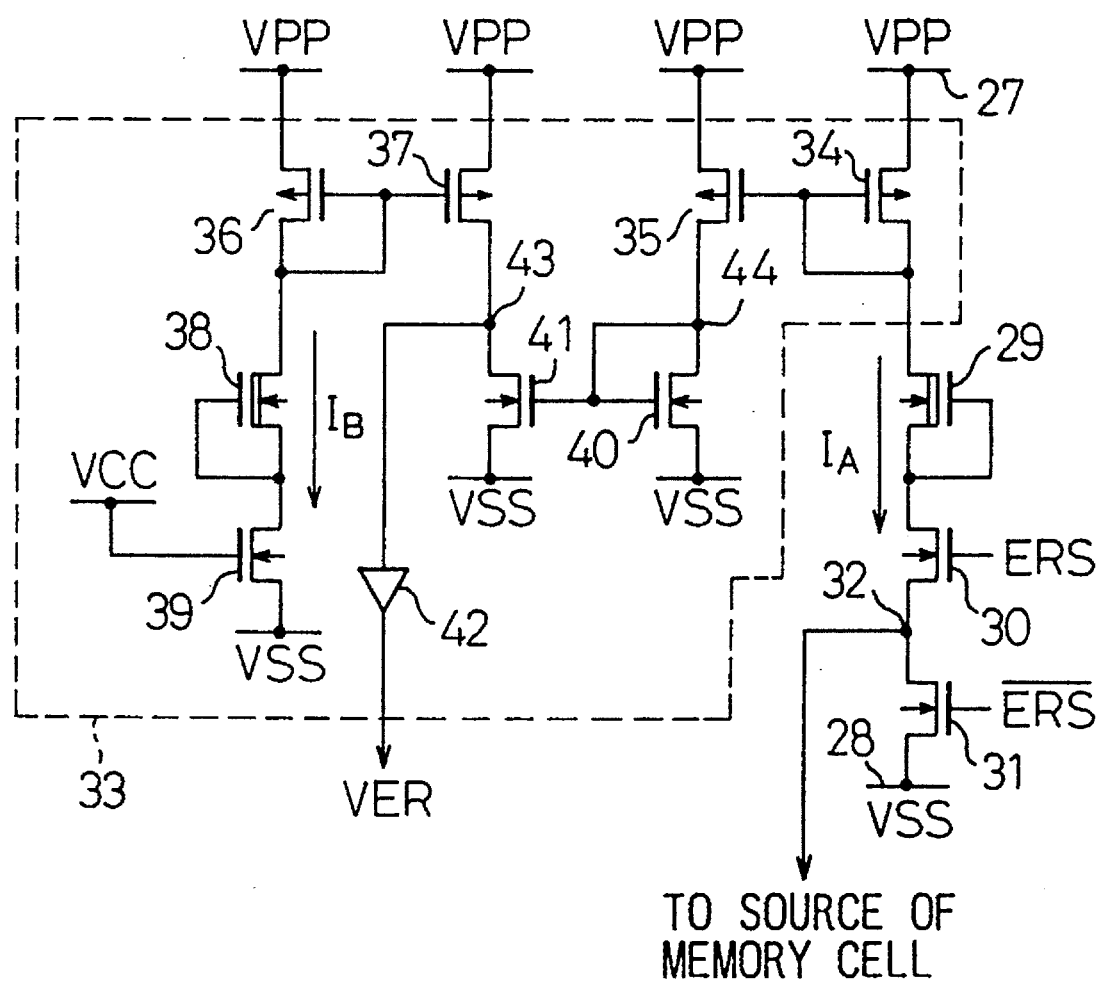
FIG. 2 is a circuit diagram illustrating a source power supply circuit employed in the first embodiment of the present invention.

FIG. 2 is a diagram illustrating the constitution of the source power supply circuit 25 which includes an erase current monitoring circuit.

In FIG. 2, reference numeral 27 denotes a VPP power supply line for feeding a power supply voltage VPP, 28 denotes a VSS power supply line for feeding a power supply voltage VSS (0 V), and 29 denotes a depletion-type nMOS transistor which, during the erase mode, limits a maximum value in the erase voltage fed to the source of the memory cell.

Reference numeral 30 denotes an enhancement-type nMOS transistor which is turned on (conducting) or off (non-conducting) by an erase control signal ERS which controls the supply of erase voltage to the memory cell, the erase control signal ERS being formed as will be described later.

Reference numeral 31 denotes an enhancement-type nMOS transistor which is turned on or off by an inverted erase control signal/ERS which is inverted relative to the erase control signal ERS, and its node 32 is connected to the source of the memory cell.

Reference numeral 33 denotes an erase current monitoring circuit which, during the erase mode, monitors the current $I_A$ that flows into the source of the memory cell when the power supply voltage VPP is applied as the erase voltage to the source of the memory cell in order to judge whether a current that is flowing into the source of the memory cell is smaller than a predetermined value or not.

In the erase current monitoring circuit 33, reference numerals 34 and 35 denote enhancement-type pMOS transistors constituting a current mirror circuit for detecting the current that $I_A$ flows into the source of the memory cell.

Reference numerals 36 and 37 denote enhancement-type pMOS transistors that correspond to the pMOS transistors 34 and 35, and constitute a current mirror circuit, and reference numeral 38 denotes a depletion-type nMOS transistor that corresponds to the nMOS transistor 29.

Reference numeral 39 denotes an enhancement-type nMOS transistor that corresponds to the nMOS transistor 30. The nMOS transistor 39 is supplied with the power supply voltage VCC (5 V) through the gate thereof, and is normally turned on.

Reference numerals 40 and 41 denote enhancement-type nMOS transistors, 42 denotes a buffer for judging the logic level at the node 43, and VER denotes a verify control signal for controlling whether the erase verify operation is carried out, or not, after the erase voltage has been applied to the source of the memory cell.

When the verify control signal VER is at the L level (low level) during the erase mode, the erase verification is not effected as will be described later but the erase voltage is repetitively applied to the source of the memory cell. Only when the verify control signal VER has the H level (high level), is the erase verification effected after the erase voltage is applied to the source of the memory cell.

Figure 3:
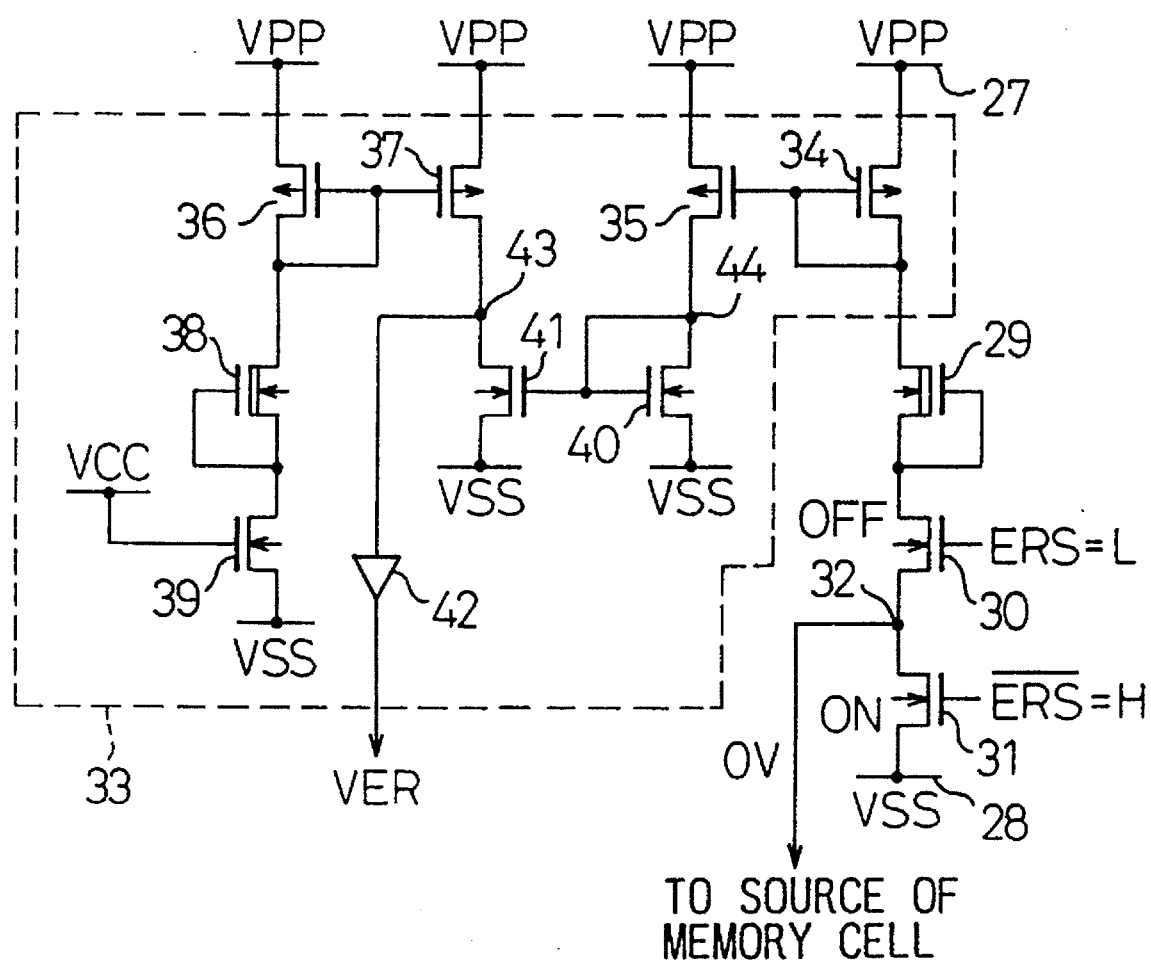
FIG. 3 is a circuit diagram illustrating the operation of the source power supply circuit employed in the first embodiment of the present invention.

In cases other than when the erase voltage is applied to the source of the memory cell as shown in FIG. 3, the erase control signal ERS has the L level, the inverted erase control signal/ERS has the H level, the nMOS transistor 30 is turned off, the nMOS transistor 31 is turned on, and a power supply voltage VSS of 0 V is applied to the source of the memory cell.

Figure 4:
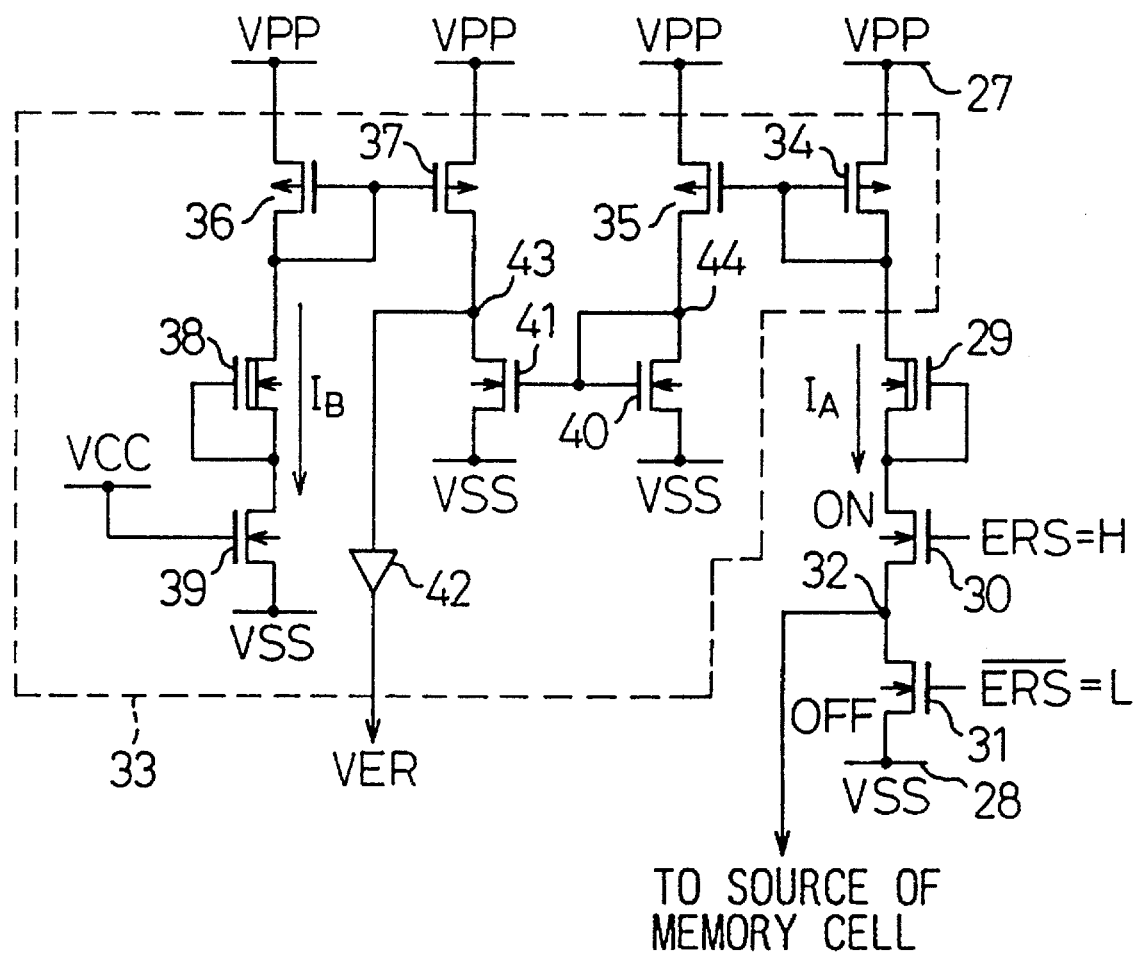
FIG. 4 is a circuit diagram illustrating the operation of the source power supply circuit employed in the first embodiment of the present invention.

On the other hand, when the erase voltage is applied to the source of the memory cell as shown in FIG. 4, the erase control signal ERS is at the H level, the inverted erase control signal/ERS is at the L level, the nMOS transistor 30 is turned on, nMOS transistor 31 is turned off, and the power supply voltage VPP is applied to the source of the memory cell via pMOS transistor 34 and the nMOS transistors 29, 30.

Figure 5:
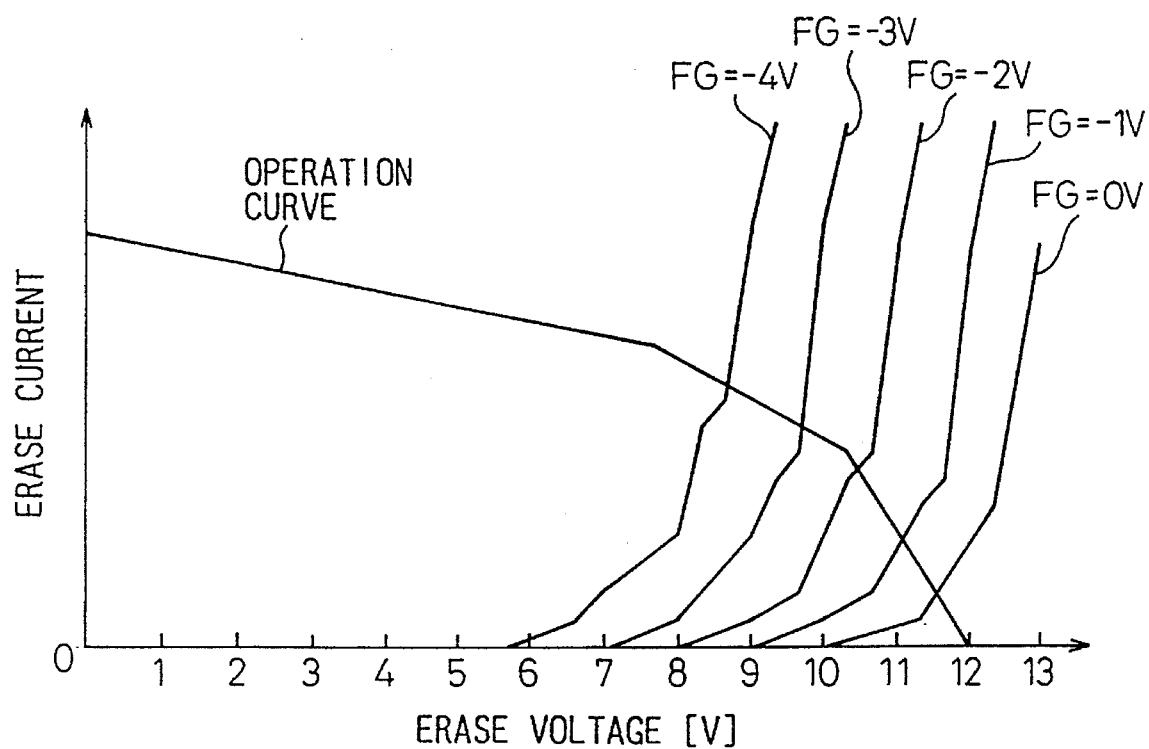
FIG. 5 is a diagram showing erase current vs. erase voltage characteristics of a memory cell and an operation curve of an erase voltage application circuit.

FIG. 5 is a diagram illustrating the erase current vs. erase voltage characteristics of a memory cell and an operation curve of an erase voltage application circuit, wherein the abscissa represents the erase voltage applied to the source of the memory cell and the ordinate represents the erase current that flows into the source of the memory cell.

That is, even when VPPH=12 [V] is applied as a power supply voltage VPP to the VPP power supply line 27 of the source power supply circuit 25 in a state where the floating gate (FG) is assuming a negative voltage, e.g., –4 [V], the erase current is so large that the erase voltage applied to the source of the memory cell becomes 8.7 [V].

The erase current decreases as the voltage at the floating gate approaches 0 [V], i.e., as the erase state is assumed. Therefore, the erase voltage applied to the source of the memory cell approaches 12 [V].

According to the first embodiment, therefore, the circuit constant is so set that a current which is equal to the erase current $I_A$ flowing into the source of the memory cell flows at all times as a reference current $I_B$ into a current path made up of pMOS transistor 36 and nMOS transistors 38, 39 when the erase voltage applied to the source of the memory cell is 10.5 [V], i.e., when the voltage at the floating gate is –2 [V] which is the non-erased state in a state where VPPH=12 [V]

is applied as the power supply voltage VPP to the VPP power supply line 27 of the source power supply circuit 25.

In the source power supply circuit 25, therefore, the erase current $I_A$ flowing into the source of the memory cell becomes larger than the reference current $I_B$ until the voltage at the floating gate becomes −2 [V] after the erasing is started.

As a result, the voltage at a node 43 becomes smaller than the voltage at a node 44, whereby the verify control signal VER assumes the L level which is then latched by the command control circuit 21.

In the case described above, the erase verification is not effected, and the erase voltage is repetitively applied to the source of the memory cell.

Then, as the voltage at the floating gate rises to become larger than −2 [V], the current $I_A$ flowing into the source of the memory cell becomes smaller than the reference current $I_B$.

As a result, the voltage at the node 43 becomes larger than the voltage at the node 44, whereby the verify control signal VER assumes the H level which is then latched by the command control circuit 21.

Then, as described above, the erase verification is effected after the erase voltage is applied to the source of the memory cell.

Figure 6:
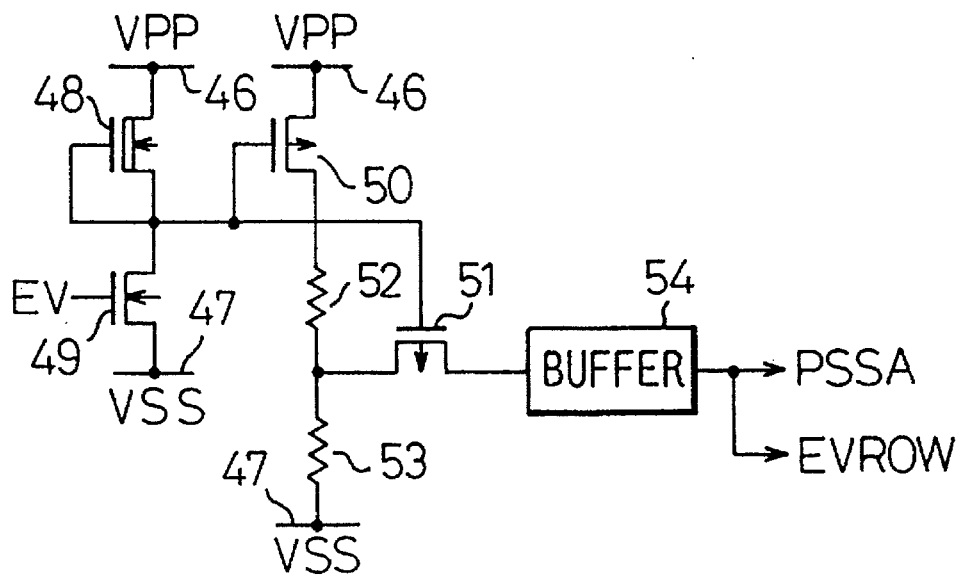
FIG. 6 is a diagram illustrating a verify voltage-generating circuit employed in the first embodiment of the present invention.

In this first embodiment, furthermore, the internal power supply circuit 23 is provided with a verify voltage-generating circuit as shown in FIG. 6.

In FIG. 6, reference numeral 46 denotes a VPP power supply line, 47 denotes a VSS power supply line, 48 denotes a depletion-type nMOS transistor that serves as a load element, and 49 denotes an enhancement-type nMOS transistor which is turned on and off by an erase verify control signal EV that is formed as will be described later.

Furthermore, as will be described, the erase verification is inhibited when the erase verify control signal EV is at the L level and the erase verification is effected when the erase verify control signal EV is at the H level.

Reference numerals 50 and 51 denote enhancement-type pMOS transistors which are turned on and off by the drain voltage of the nMOS transistor 49, and reference numerals 52 and 53 denote resistors for dividing the power supply voltage VPP. Reference numeral 54 denotes a buffer. The output of the buffer 54 is fed to the sense amplifier 16 as a sense amplifier load voltage PSSA and is further fed, as an erase verify gate voltage EVROW, to the gate voltage feeding circuit that will be described later.

Figure 7:
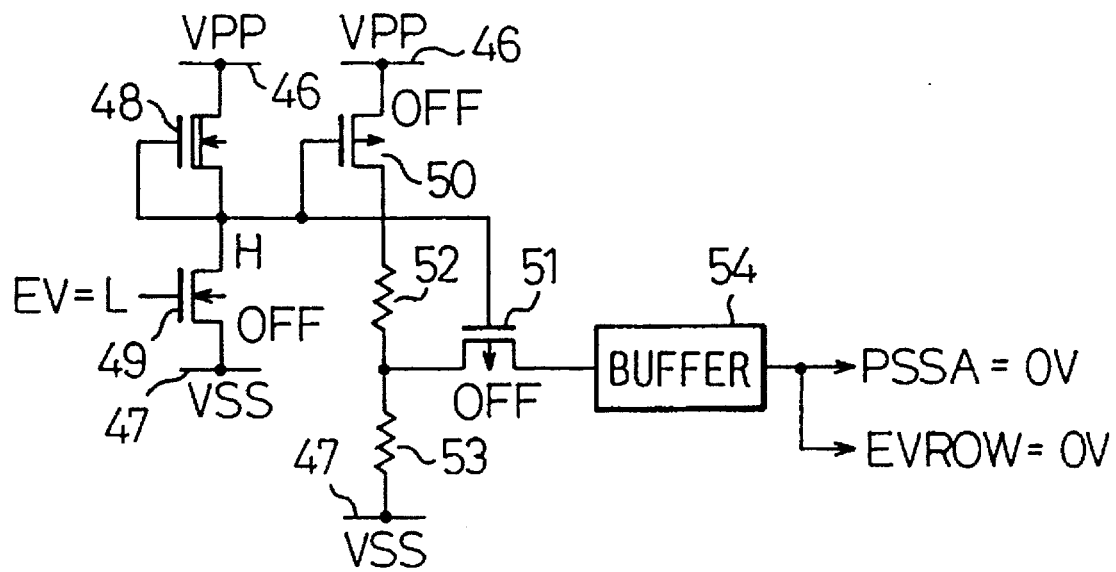
FIG. 7 is a diagram illustrating the operation of the verify voltage-generating circuit employed in the first embodiment of the present invention.

In the verify voltage-generating circuit as shown in FIG. 7, when the erase verify control signal EV is at the L level, the nMOS transistor 49 is turned off and the drain voltage of the nMOS transistor 49 assumes the H level.

As a result, the pMOS transistors 50 and 51 are turned off, the sense amplifier load voltage PSSA becomes 0 V, the erase verify gate voltage EVROW becomes 0 V, and the erase verification is inhibited.

Figure 8:
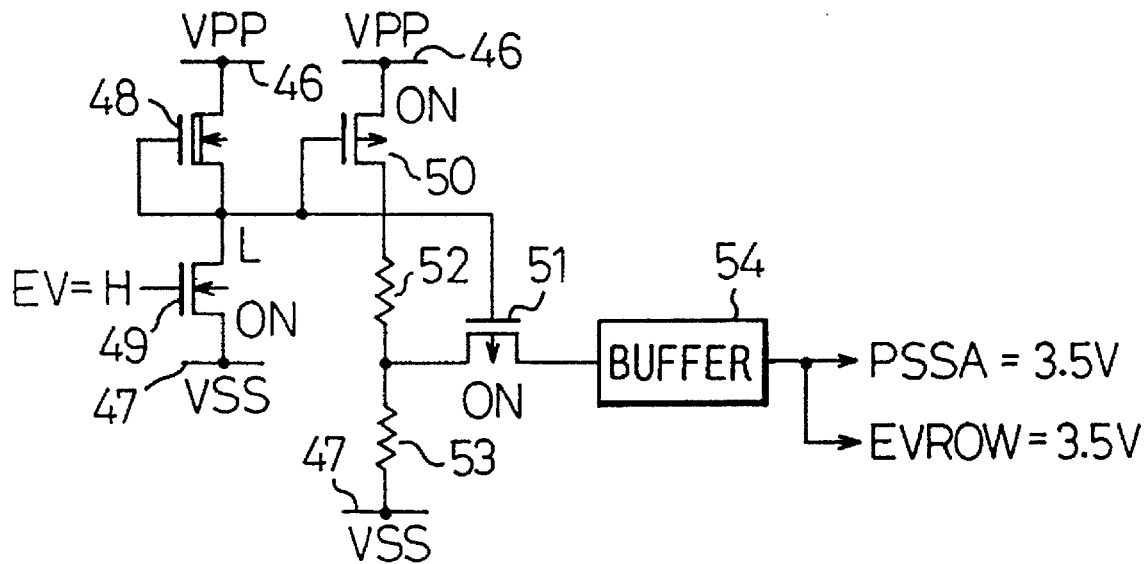
FIG. 8 is a diagram illustrating the operation of the verify voltage-generating circuit employed in the first embodiment of the present invention.

On the other hand, when the erase verify control signal EV has the H level as shown in FIG. 8, the nMOS transistor 49 is turned on and the drain voltage of the nMOS transistor 49 assumes the L level.

As a result, the pMOS transistors 50 and 51 are turned on, the sense amplifier load voltage PSSA becomes 3.5 V, the erase verify gate voltage EVROW becomes 3.5 V, and erase verification is effected.

Figure 9:
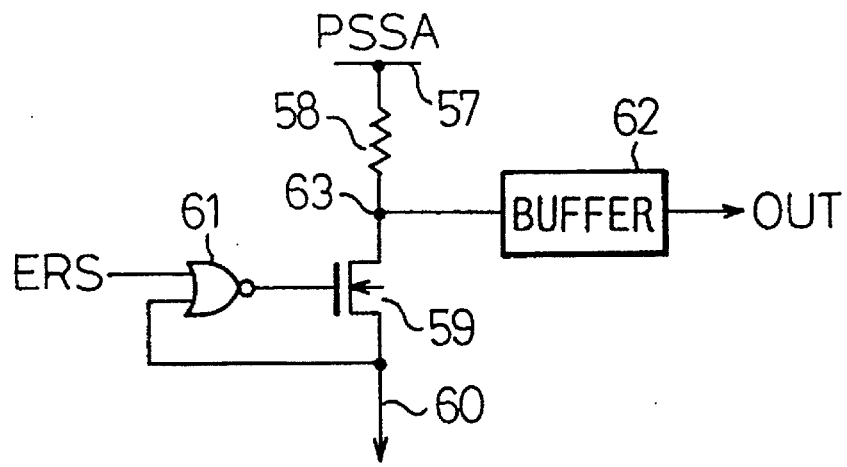
FIG. 9 is a circuit diagram illustrating a bit portion of a sense amplifier employed in the first embodiment of the present invention.

FIG. 9 is a circuit diagram illustrating a bit portion of the sense amplifier 16, wherein reference numeral 57 denotes a PSSA voltage line for feeding the sense amplifier load voltage PSSA, 58 denotes a load resistor, 59 denotes an enhancement-type nMOS transistor, 60 denotes a bit line connected to the drain of the memory cell, 61 denotes a NOR circuit, 62 denotes a buffer, and OUT denotes output data.

In this sense amplifier, when the erase verification is effected in the erase mode, the erase control signal ERS assumes the L level, the NOR circuit 61 works as an inverter for the voltage of the bit line 60, and nMOS transistor 59 and NOR circuit 61 work as a negative feedback amplifier circuit.

In this case, when a current flows into the drain of a memory cell connected to the bit line 60, the node 63 assumes the L level and the output data OUT assumes the L level. When no current flows into the drain of the memory cell connected to the bit line 60, the node 63 assumes the H level and the output data OUT assumes the H level.

Figure 10:
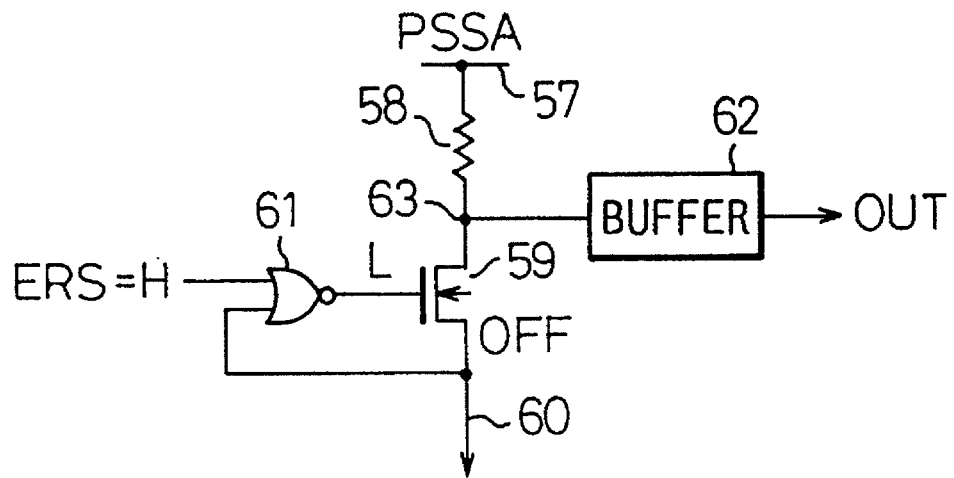
FIG. 10 is a circuit diagram illustrating the operation of the bit portion of the sense amplifier employed in the first embodiment of the present invention.

On the other hand, when the erase voltage is applied to the source of the memory cell in the erase mode as shown in FIG. 10, the erase control signal ERS assumes the H level, the output of NOR circuit 61 assumes the L level, nMOS transistor 59 is turned off, and bit line 60 is opened.

Figure 11:
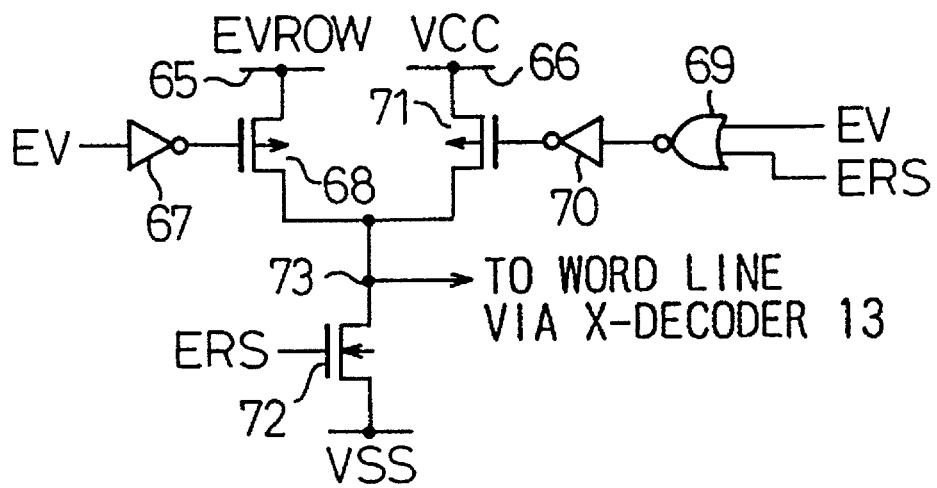
FIG. 11 is a diagram illustrating a gate voltage-feeding circuit employed in the first embodiment of the present invention.

In the first embodiment, furthermore, the internal power supply circuit 23 is provided with a gate voltage feeding circuit as shown in FIG. 11.

In FIG. 11, reference numeral 65 denotes an EVROW voltage line for feeding an erase verify gate voltage EVROW that is output from the verify voltage-generating circuit shown in FIG. 6, and 66 denotes a VCC power supply line for feeding the power supply voltage VCC.

Reference numeral 67 denotes an inverter for inverting the erase verify control signal EV, and 68 denotes an enhancement-type pMOS transistor which is turned on and off by the output of the inverter 67.

Reference numeral 69 denotes a NOR circuit which subjects the erase verify control signal EV and the erase control signal ERS to a NOR process, 70 denotes an inverter for inverting the output of the NOR circuit 69, and 71 denotes an enhancement-type pMOS transistor which is turned on or off by the output of the inverter 70.

Reference numeral 72 denotes an enhancement-type nMOS transistor which is turned on and off by the erase control signal ERS, and the voltage at the node 73 is applied to the word line via the X-decoder 13.

Figure 12:
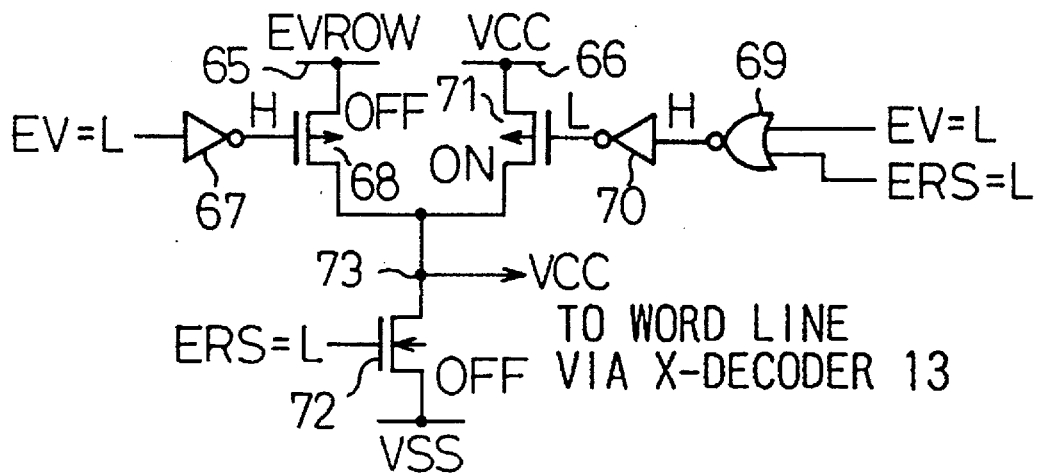
FIG. 12 is a diagram illustrating the operation of the gate voltage-feeding circuit employed in the first embodiment of the present invention.

In the gate voltage feeding circuit as shown in FIG. 12, the erase verify control signal EV assumes the L level and the erase control signal ERS assumes the L level at the time of reading the data.

As a result, the output of inverter 67 assumes the H level, the pMOS transistor 68 is turned off, the output of NOR circuit 69 assumes the H level, the output of inverter 70 assumes the L level, the pMOS transistor 71 is turned on, the nMOS transistor 72 is turned off, and the power supply voltage VCC is applied to the word line.

Figure 13:
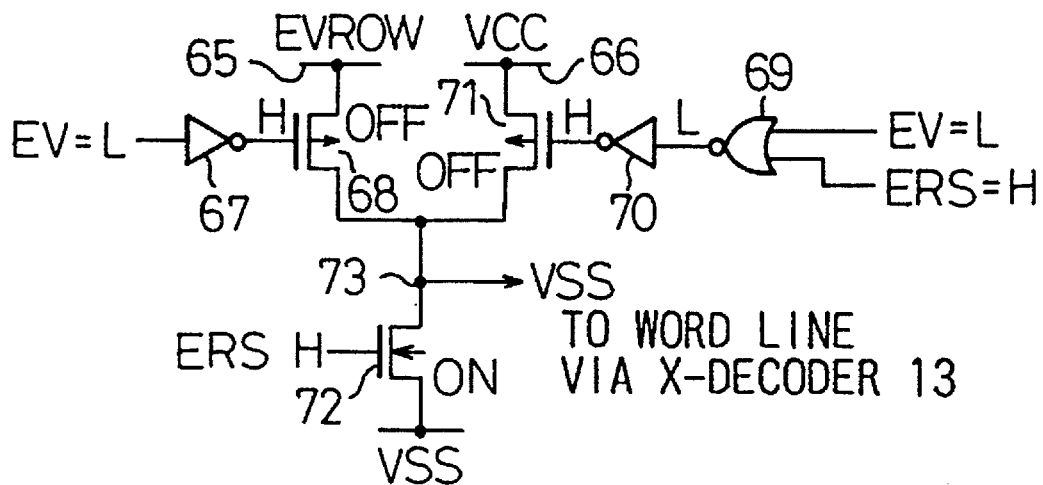
FIG. 13 is a diagram illustrating the operation of the gate voltage-feeding circuit employed in the first embodiment of the present invention.

On the other hand, when the erase voltage is applied to the source of the memory cell in the erase mode as shown in FIG. 13, the erase verify control signal EV assumes the L level and the erase control signal ERS assumes the H level.

As a result, the output of inverter 67 assumes the H level, the pMOS transistor 68 is turned off, the output of NOR circuit 69 assumes the L level, the output of inverter 70 assumes the H level, the pMOS transistor 71 is turned off, the nMOS transistor 72 is turned on, and the power supply voltage VSS is applied to the word line.

Figure 14:
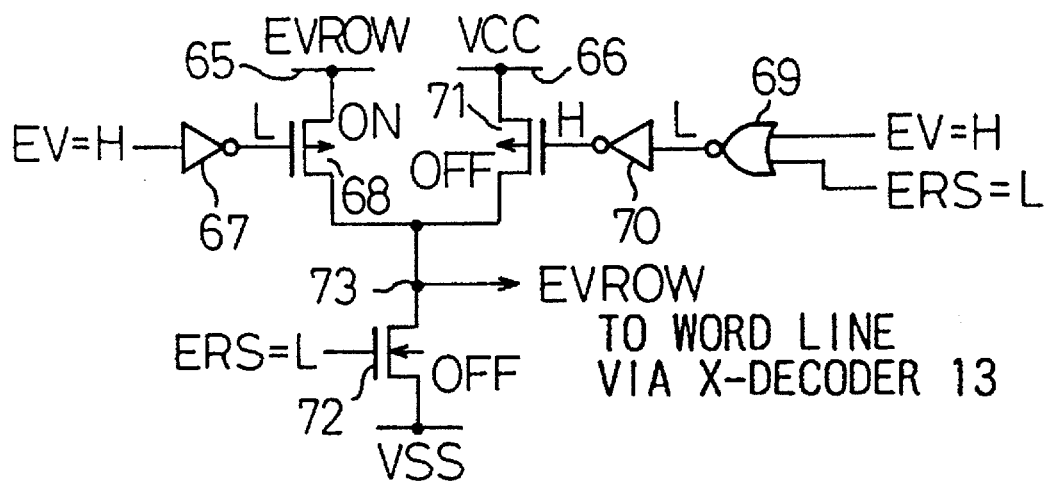
FIG. 14 is a diagram illustrating the operation of the gate voltage-feeding circuit employed in the first embodiment of the present invention.

At the time of erase verification as shown in FIG. 14, the erase verify control signal EV assumes the H level and the erase control signal ERS assumes the L level.

As a result, the output of inverter 67 assumes the L level, the pMOS transistor 68 is turned on, the output of NOR circuit 69 assumes the L level, the output of inverter 70 assumes the H level, the pMOS transistor 71 is turned off, the nMOS transistor 72 is turned off, and the erase verify voltage EVROW=3.5 [V] is applied to the word line.

Figure 15:
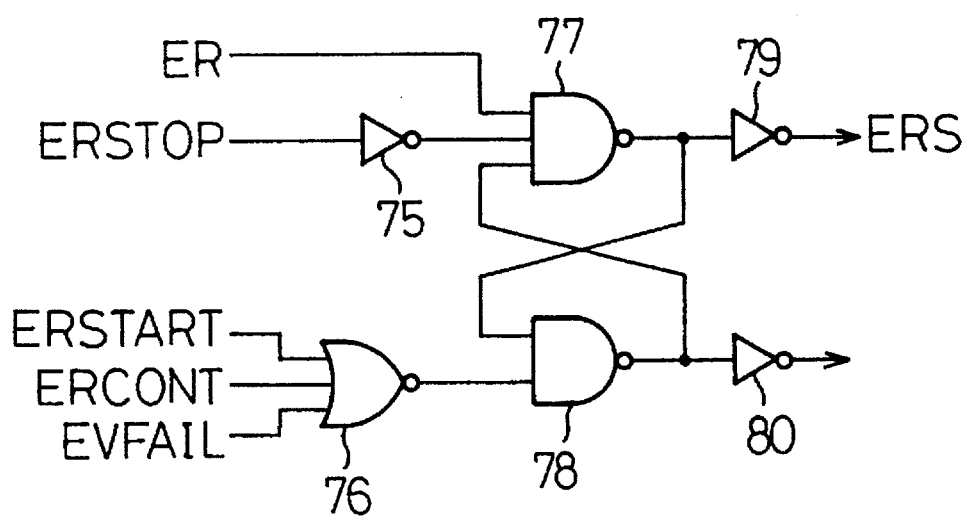
FIG. 15 is a diagram illustrating an erase control signal (ERS)-forming circuit employed in the first embodiment of the present invention.

Here, the erase control signal ERS is formed by an erase control signal-forming circuit shown in FIG. 15 that is provided in the command control circuit 21.

In FIG. 15, symbol ER denotes an erase signal for setting the erase mode, ERSTOP denotes an erase stop signal for interrupting the application of erase voltage to the source of the memory cell, and ERSTART denotes an erase start signal for starting the erase mode operation.

Symbol ERCONT denotes an erase-control-signal-rise-control signal which causes the erase control signal ERS of the L level to assume the H level again to start the application of the erase voltage to the source of the memory cell when the verify control signal VER has the L level, i.e., when erase verification is not effected.

Symbol EVFAIL denotes an erase verify fail signal which indicates that the time for applying the erase voltage is not sufficient as a result of erase verification and that non-erased memory cells exist.

Reference numeral 75 denotes an inverter for inverting the erase stop signal ERSTOP, and 76 denotes a NOR circuit for subjecting the erase start signal ERSTART, erase-control-signal-rise-control signal ERCONT and erase verify fail signal EVFAIL to a NOR process.

Reference numerals 77 and 78 denote NAND circuits constituting a flip-flop circuit, 79 denotes an inverter for outputting the erase control signal ERS by inverting the output of the NAND circuit 77, and 80 denotes an inverter for inverting the output of the NAND circuit 78, the inverter 80 corresponding to the inverter 79 to maintain a balance.

FIG. 16 and FIGS. 17 to 19 are a waveform diagram and circuit diagrams for explaining the operation of the erase control signal-forming circuit.

Figure 17:
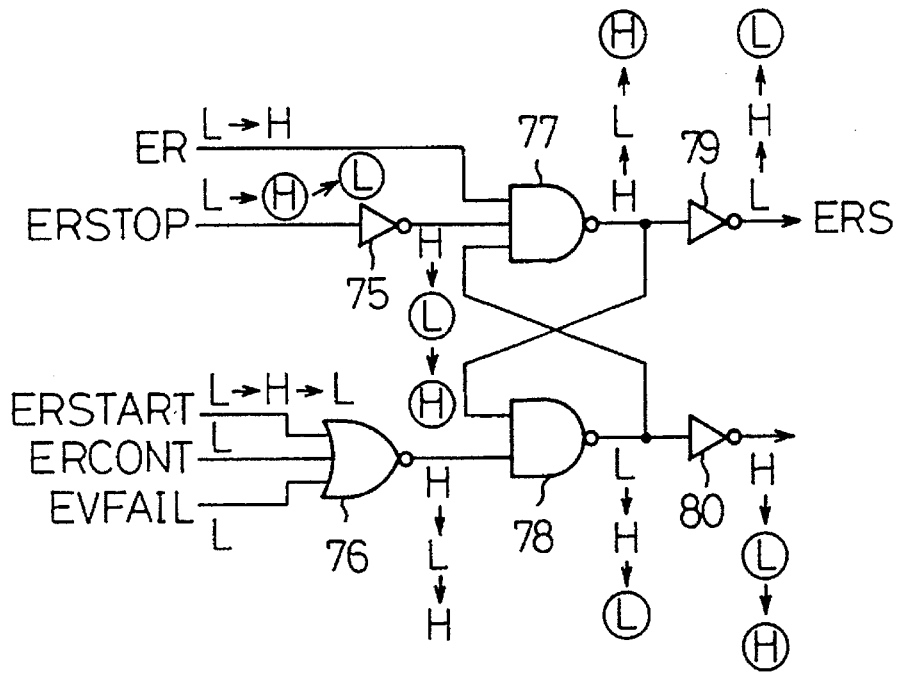
FIG. 17 is a diagram illustrating the operation of the erase control signal (ERS)-forming circuit employed in the first embodiment of the present invention.

In this erase control signal-forming circuit as shown in FIG. 17, when the erase signal ER is at the L level, the erase stop signal ERSTOP is at the L level, the erase start signal ERSTART is at the L level, the erase-control-signal-rise-control signal ERCONT is at the L level and the erase verify fail signal EVFAIL is at the H level, then, the output of inverter 75 is at the H level, the output of NOR circuit 76 is at the H level, the output of NAND circuit 77 is at the H level, the output of NAND circuit 78 is at the L level, and the erase control signal ERS is at the L level.

When the erase signal ER assumes the H level in this state, the erase start signal ERSTART assumes the H level as will be described later. As a result, the output of NOR circuit 76 assumes the L level, the output of NAND circuit 78 assumes the H level, the output of NAND circuit 77 assumes the L level, and the erase control signal ERS assumes the H level.

Then, the erase start signal ERSTART assumes the L level and the output of NOR circuit 76 assumes the H level. In this case, since the output of NAND circuit 77 is at the L level, the output of NAND circuit 78 maintains the H level and the erase control signal ERS maintains the H level.

Next, as the erase stop signal ERSTOP assumes the H level, the output of inverter 75 assumes the L level, the output of NAND circuit 77 assumes the H level, the output of NAND circuit 78 assumes the L level, and the erase control signal ERS assumes the L level.

Then, as the erase stop signal ERSTOP assumes the L level, the output of inverter 75 assumes the H level. In this case, however, since the output of the NAND circuit 78 is at the L level, the output of NAND circuit 77 assumes the H level and the erase control signal ERS maintains the L level.

Figure 18:
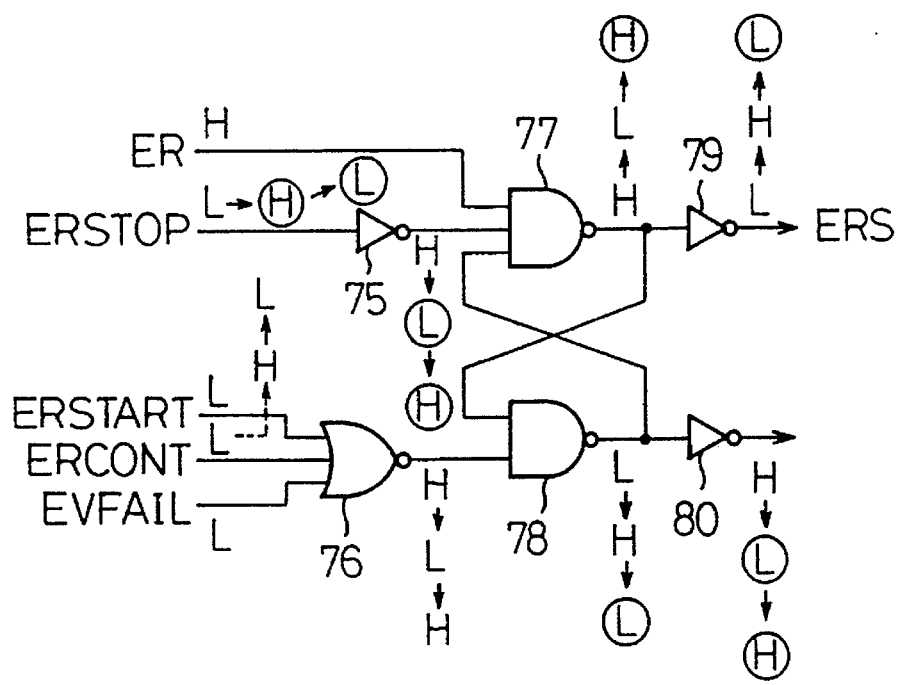
FIG. 18 is a diagram illustrating the operation of the erase control signal (ERS)-forming circuit employed in the first embodiment of the present invention.

Then, as the erase-control-signal-rise-control signal ERCONT assumes the H level in this state as shown in FIG. 18, the output of NOR circuit 76 assumes the L level, the output of NAND circuit 78 assumes the H level, the output of NAND circuit 77 assumes the L level, and the erase control signal ERS assumes the H level.

Thereafter, as the erase-control-signal-rise-control signal ERCONT assumes the L level, the output of NOR circuit 76 assumes the H level. In this case, however, since the output of NAND circuit 77 is at the L level, the output of NAND circuit 78 maintains the H level and the erase control signal ERS maintains the L level.

Next, when the erase stop signal ERSTOP assumes the H level, the output of inverter 75 assumes the L level, the output of NAND circuit 77 assumes the H level, the output of NAND circuit 78 assumes the L level and the erase control signal ERS assumes the L level.

Then, when the erase stop signal ERSTOP assumes the L level, the output of inverter 75 assumes the H level. In this case, however, since the output of NAND circuit 78 is at the L level, the output of NAND circuit 77 maintains the H level and the erase control signal ERS maintains the L level.

Figure 19:
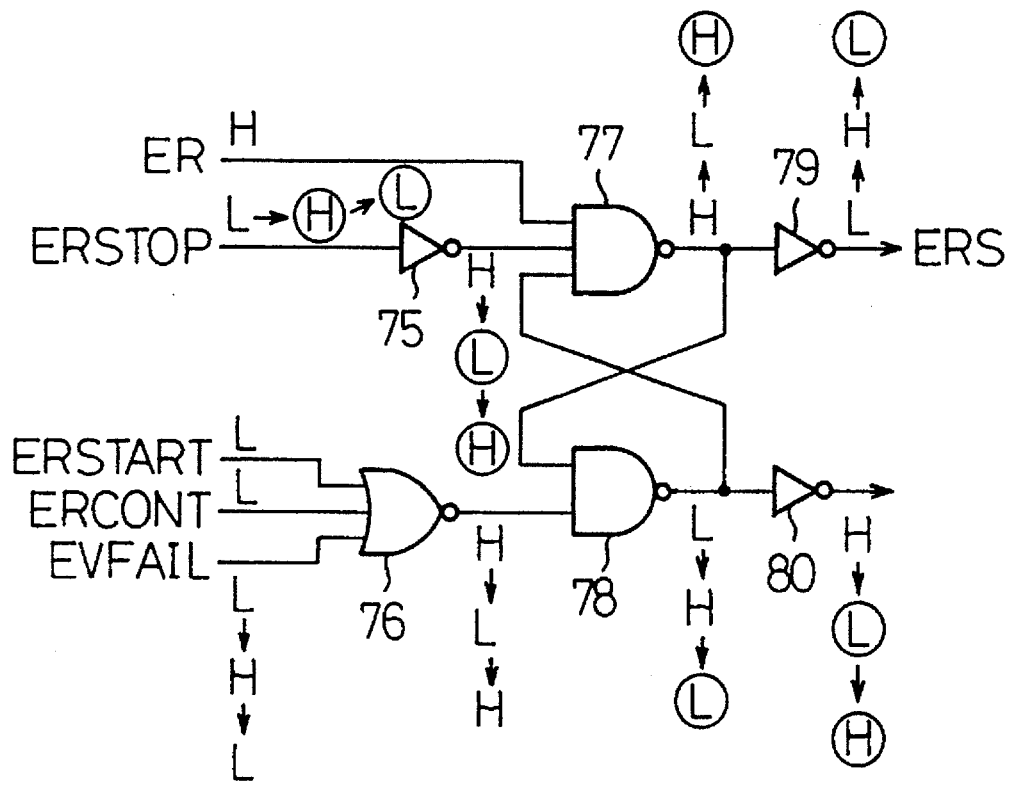
FIG. 19 is a diagram illustrating the operation of the erase control signal (ERS)-forming circuit employed in the first embodiment of the present invention.

Next, when the erase verify fail signal EVFAIL assumes the H level in the state shown in FIG. 19, the output of the NOR circuit 76 assumes the L level, the output of NAND circuit 78 assumes the H level, the output of NAND circuit 77 assumes the L level, and the erase control signal ERS assumes the H level.

Then, as the erase verify fail signal EVFAIL assumes the L level, the output of NOR circuit 76 assumes the H level. In this case, however, since the output of NAND circuit 77 is at the L level, the output of NAND circuit 78 maintains the H level and the erase control signal ERS maintains the L level.

That is, the erase control signal-forming circuit produces the erase control signal ERS at the H level when the erase start signal ERSTART, the erase-control-signal- rise-control signal ERCONT or the erase verify fail signal EVFAIL changes from the L level to the H level and produces the erase control signal ERS at the L level when the erase stop signal ERSTOP is at the H level.

Figure 20:
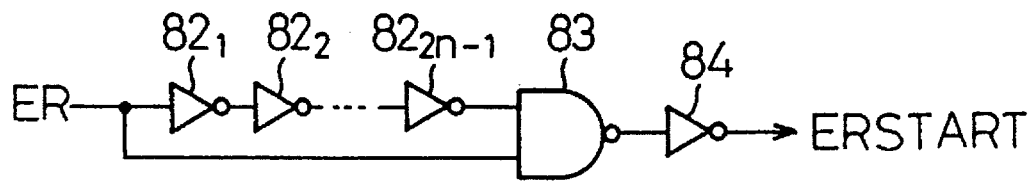
FIG. 20 is a diagram illustrating an erase start signal (ERSTART)-forming circuit employed in the first embodiment of the present invention.

The erase start signal ERSTART needed by the erase control signal-forming circuit is produced by the erase start signal-forming circuit, shown in FIG. 20, that is provided in the command control circuit 21.

In FIG. 20, reference numerals $82_1$ to $82_{2n-1}$ (n is an integer of 2 or larger, $82_3$ to $82_{2n-2}$ are not diagramed) denote inverters constituting an inverting delay circuit, 83 denotes a NAND circuit which subjects the output of the inverter $82_{2n-1}$ and the erase signal ER to a NAND process, and 84 denotes an inverter which outputs the erase start signal ERSTART by inverting the output of the NAND circuit 83.

Figure 21:
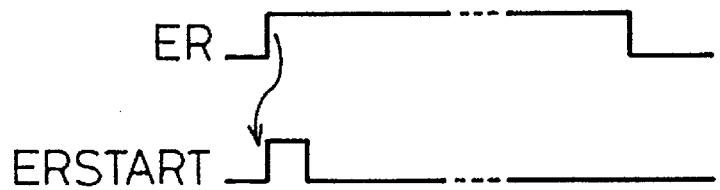
FIG. 21 is a diagram illustrating the operation of the erase start signal (ERSTART)-forming circuit employed in the first embodiment of the present invention.
Figure 22:
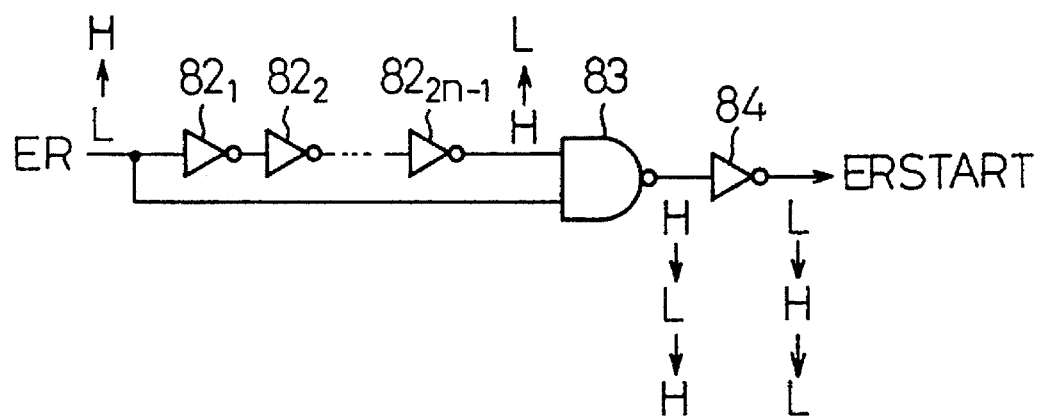
FIG. 22 is a diagram illustrating the operation of the erase start signal (ERSTART)-forming circuit employed in the first embodiment of the present invention.
Figure 23:
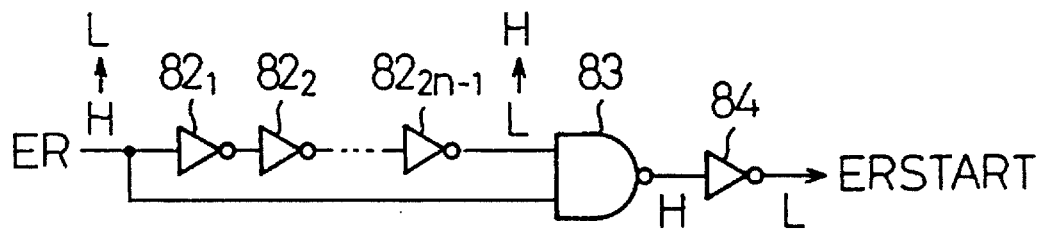
FIG. 23 is a diagram illustrating the operation of the erase start signal (ERSTART)-forming circuit employed in the first embodiment of the present invention.

FIGS. 21, 22 and 23 are a waveform diagram and circuit diagrams for explaining the operation of the erase start signal-forming circuit.

That is, in the erase start signal-forming circuit as shown in FIG. 22, when the erase signal ER is at the L level, the output of inverter $82_{2n-1}$ is at the H level, the output of NAND circuit 83 is at the H level, and erase start signal ERSTART is at the L level.

When the erase signal ER assumes the H level in this state, the output of inverter $82_{2n-1}$ maintains the H level until the delay time determined by the inverters $82_1$ to $82_{2n-1}$ passes and, hence, the output of NAND circuit 83 assumes the L level and the erase start signal ERSTART assumes the H level.

Then, after the passage of the delay time determined by the inverters $82_1$ to $82_{2n-1}$, the output of inverter $82_{2n-1}$ assumes the L level, the output of NAND circuit 83 assumes the H level and the erase start signal ERSTART assumes the L level.

When the erasing is completed as shown in FIG. 23, the erase signal ER assumes the L level. In this case, the output of the NAND circuit 83 assumes the H level and the erase start signal ERSTART maintains the L level.

Then, after the passage of the delay time determined by the inverters $82_1$ to $82_{2n-1}$, the output of inverter $82_{2n-1}$ assumes the H level. In this case, however, since the erase signal ER is at the L level, the output of NAND gate 83 assumes the H level and the erase start signal ERSTART maintains the L level.

That is, as the erase signal ER changes from the L level into the H level, the erase start signal-forming circuit outputs the erase start signal ERSTART which assumes the H level for a predetermined period of time.

Figure 24:
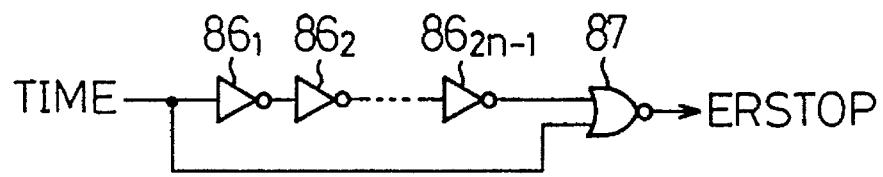
FIG. 24 is a diagram illustrating an erase stop signal (ERSTOP)-forming circuit employed in the first embodiment of the present invention.

The erase stop signal ERSTOP required by the erase control signal-forming circuit shown in FIG. 15 is produced by an erase stop signal-forming circuit, shown in FIG. 24, that is provided in the command control circuit 21.

In FIG. 24, the symbol TIME denotes an erase time signal which limits the time for applying the erase voltage to the source of the memory cell, reference numerals $86_1$ to $86_{2n-1}$ ($86_3$ to $86_{2n-2}$ are not diagramed) denote inverters that constitute an inverting delay circuit, and 87 denotes a NOR circuit which subjects the output of the inverter $86_{2n-1}$ and the erase time signal TIME to a NOR process.

Figure 25:
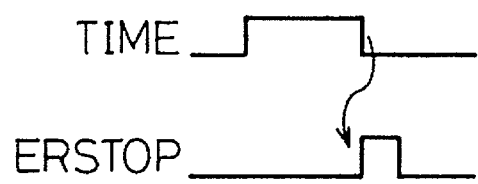
FIG. 25 is a diagram illustrating the operation of the erase stop signal (ERSTOP)-forming circuit employed in the first embodiment of the present invention.
Figure 26:
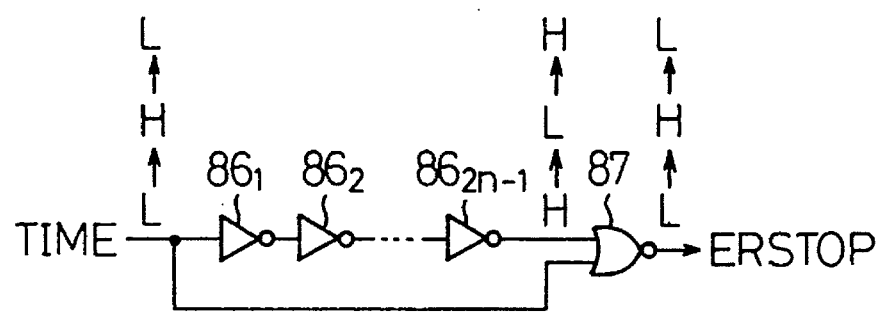
FIG. 26 is a diagram illustrating the operation of the erase stop signal (ERSTOP)-forming circuit employed in the first embodiment of the present invention.

FIGS. 25 and 26 are a waveform diagram and a circuit diagram for explaining the operation of the erase stop signal-forming circuit.

That is, in the erase stop signal-forming circuit, the output of inverter $86_{2n-1}$ assumes the H level and the erase stop signal ERSTOP assumes the L level while erase time signal TIME assumes the L level. Even when the erase time signal TIME assumes the H level in this state, the erase stop signal ERSTOP is maintained at the L level.

Then, after the passage of the delay time determined by the inverters $86_1$ to $86_{2n-1}$, the output of inverter $86_{2n-1}$ is inverted into the L level. In this case, however, the erase stop signal ERSTOP is maintained at the L level since the erase time signal TIME has the H level.

Here, as the erase time signal TIME assumes the L level, the erase stop signal ERSTOP assumes the H level since the output of inverter $86_{2n-1}$ is at the L level. Then, after the passage of the delay time determined by the inverters $86_1$ to $86_{2n-1}$, the output of inverter $86_{2n-1}$ is inverted into the H level and the erase stop signal ERSTOP assumes the L level.

That is, as the erase time signal TIME changes from the H level into the L level, the erase stop signal-forming circuit outputs the erase stop signal ERSTOP which assumes the H level for a predetermined period of time.

Figure 27:
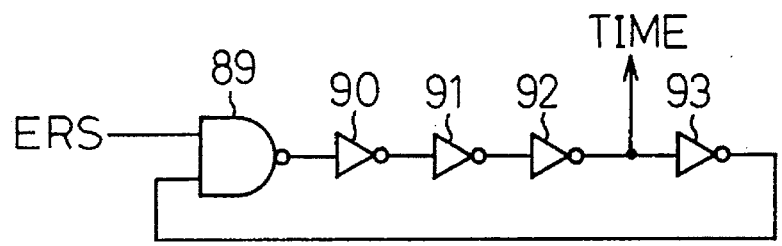
FIG. 27 is a diagram illustrating an erase time signal (TIME)-forming circuit employed in the first embodiment of the present invention.

The erase time signal TIME needed by the erase stop signal-forming circuit is formed by an erase time signal-forming circuit, shown in FIG. 27, that is provided in the command control circuit 21. In FIG. 27, reference numeral 89 denotes a NAND circuit, and 90 to 93 denote inverters.

Figure 28:
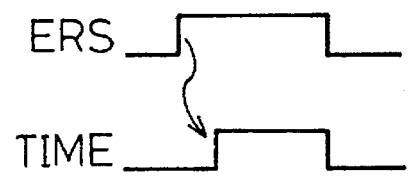
FIG. 28 is a diagram illustrating the operation of the erase time signal (TIME)-forming circuit employed in the first embodiment of the present invention.
Figure 29:
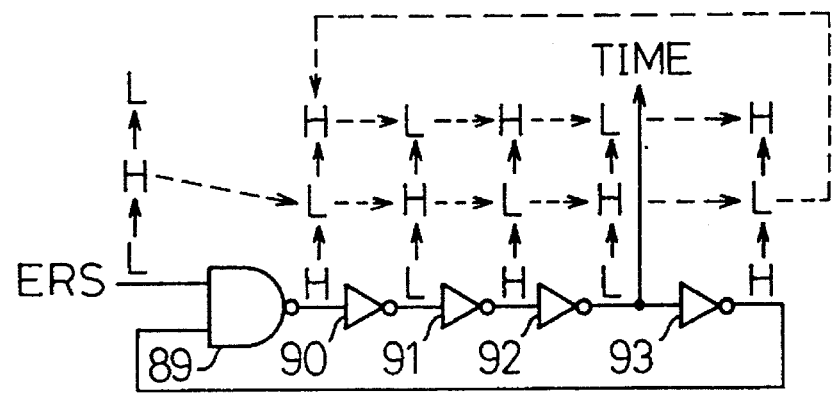
FIG. 29 is a diagram illustrating the operation of the erase time signal (TIME)-forming circuit employed in the first embodiment of the present invention.

FIGS. 28 and 29 are a waveform diagram and a circuit diagram for explaining the operation of the erase time signal-forming circuit.

That is, as far as the erase control signal ERS is at the L level in this erase time signal-forming circuit, the output of NAND circuit 89 is at the H level, output of inverter 90 is at the L level, the output of inverter 91 is at the H level, the erase time signal TIME is at the L level, and output of inverter 93 is at the H level.

When the erase control signal ERS assumes the H level in this state, the output of NAND circuit 89 assumes the L level, the output of inverter 90 assumes the H level, the output of inverter 91 assumes the L level, the erase time signal TIME assumes the H level, and the output of inverter 93 assumes the L level.

As a result, output of NAND circuit 89 assumes the H level, the output of inverter 90 assumes the L level, the output of inverter 91 assumes the H level, the erase time signal TIME assumes the L level, and the output of inverter 93 assumes the H level.

At this moment, as will be described later, the erase control signal ERS has assumed the L level. Therefore, the output of NAND circuit 89 assumes the H level, the output of inverter 90 assumes the L level, the output of inverter 91 assumes the H level, the erase time signal TIME assumes the L level, and the output of inverter 93 assumes the H level.

Figure 30:
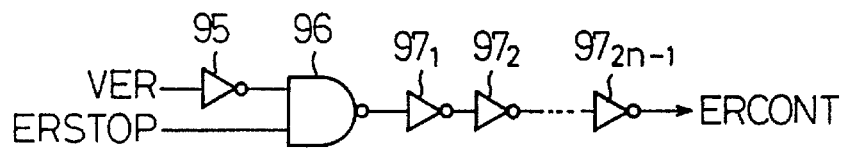
FIG. 30 is a diagram illustrating an erase-control- signal-rise-control signal (ERCONT)-forming circuit employed in the first embodiment of the present invention.

The erase-control-signal-rise-control signal ERCONT, needed by the erase control signal-forming circuit shown in FIG. 15, is formed by an erase-control-signal-rise-control signal-forming circuit, shown in FIG. 30, that is provided in the command control circuit 21.

In FIG. 30, reference numeral 95 denotes an inverter for inverting the verify control signal VER, 96 denotes a NAND circuit for subjecting the output of the inverter 95 and the erase stop signal ERSTOP to the NAND processing, and reference numerals $97_1$ to $97_{2n-1}$ ($97_3$ to $97_{2n-2}$ are not diagramed) denote inverters that constitute an inverting delay circuit.

In this erase-control-signal-rise-control signal-forming circuit, when the verify control signal VER is at the L level, the output of inverter 95 assumes the H level and the NAND circuit 96 works as an inverter for the erase stop signal ERSTOP.

Figure 32:
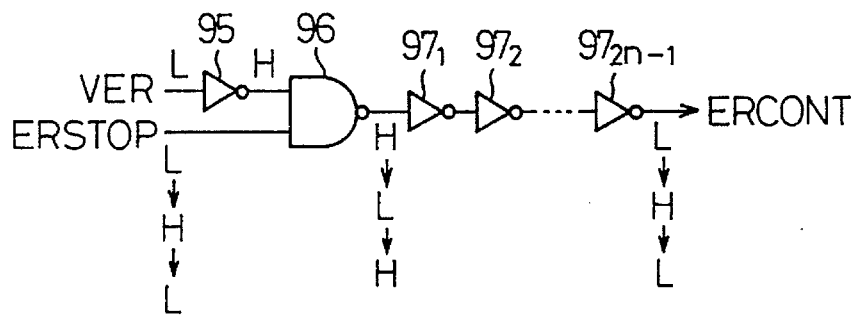
FIG. 32 is a diagram illustrating the operation of the erase-control-signal-rise-control signal (ERCONT)-forming circuit employed in the first embodiment of the present invention.

When the erase stop signal ERSTOP is at the L level as shown in FIG. 32, the output of the NAND circuit 96 assumes the H level and the erase-control-signal-rise-control signal ERCONT assumes the L level.

When the erase stop signal ERSTOP assumes the H level in this state, the output of NAND circuit 96 assumes the L level and after the passage of the delay time determined by the inverters $97_1$ to $97_{2n-1}$, the erase-control-signal-rise-control signal ERCONT assumes the H level.

Then, as the erase stop signal ERSTOP assumes the L level, the output of NAND circuit 96 assumes the H level and after the passage of the delay time determined by the inverters $97_1$ to $97_{2n-1}$, the erase-control-signal-rise-control signal ERCONT assumes the L level.

Figure 33:
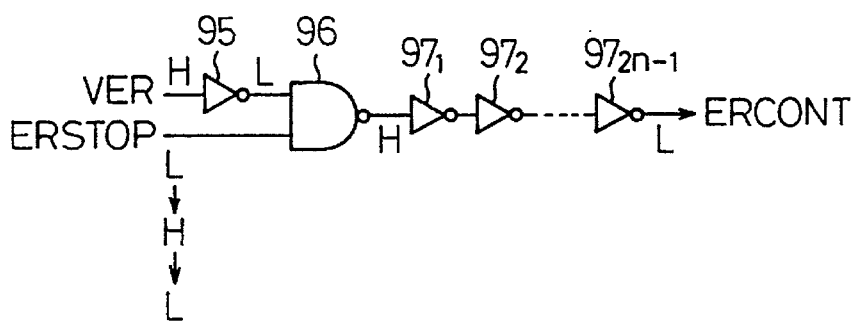
FIG. 33 is a diagram illustrating the operation of the erase-control-signal-rise-control signal (ERCONT)-forming circuit employed in the first embodiment of the present invention.

On the other hand, when the verify control signal VER is at the H level as shown in FIG. 33, the output of inverter 95 assumes the L level, whereby the output of NAND circuit 96 is fixed to the H level and the erase-control-signal-rise-control signal ERCONT is fixed to the L level.

That is, when the erase stop signal ERSTOP changes from the L level to the H level and, then, to the L level in a state where the verify control signal VER is at the L level, the erase-control-signal-rise-control signal-forming circuit outputs the erase-control-signal-rise-control signal ERCONT which is obtained by delaying the erase stop signal ERSTOP by a predetermined period of time.

Figure 34:
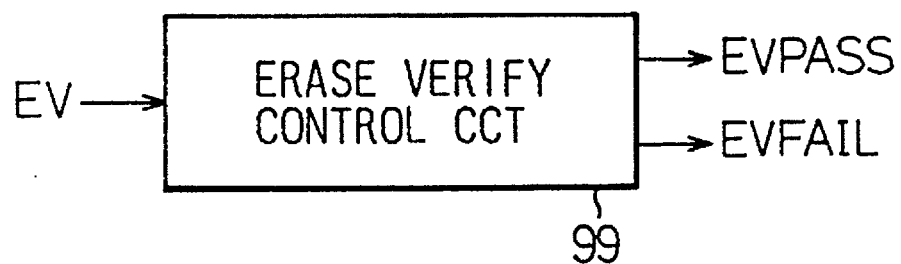
FIG. 34 is a diagram illustrating an erase verify control circuit employed in the first embodiment of the present invention.

The erase verify fail signal EVFAIL, needed by the erase control signal-forming circuit shown in FIG. 15, is output from an erase verify control circuit 99 of which the active state or the inactive state is controlled by the erase verify control signal EV as shown in FIG. 34.

The symbol EVPASS denotes an erase verify pass signal which indicates that the time of applying the erase voltage is sufficient, and no non-erased memory cell exists, as a result of erase verification.

That is, when the existence of non-erased memory cells is confirmed as a result of erase verification, an erase verify fail signal EVFAIL of the H level is output.

When it is confirmed that there no non-erased memory cells exist as a result of erase verification, an erase verify pass signal at the H level is output.

Figure 35:
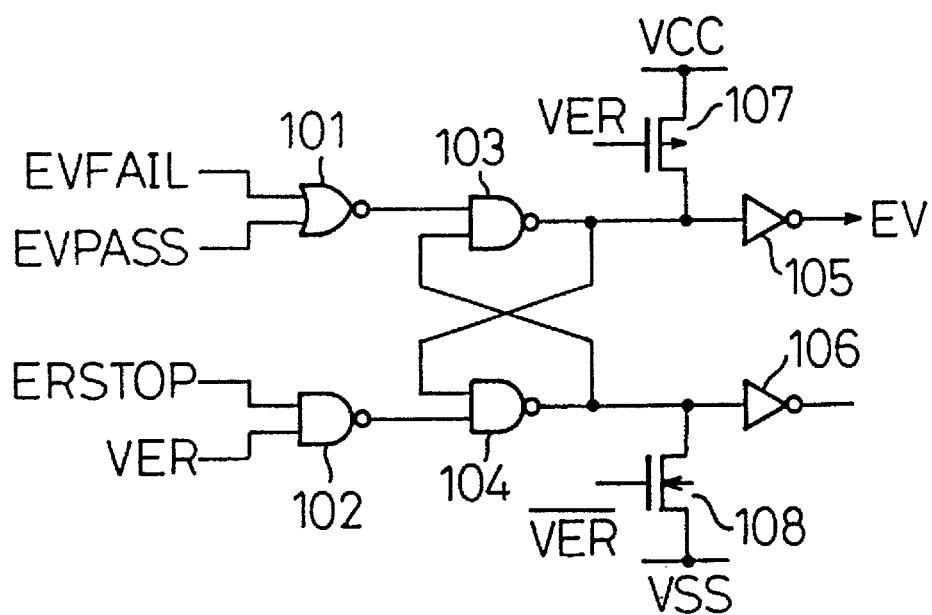
FIG. 35 is a diagram illustrating an erase verify control signal (EV)-forming circuit employed in the first embodiment of the present invention.

Here, the erase verify control signal EV needed by the erase verify control circuit 99 is formed by an erase verify control signal-forming circuit, shown in FIG. 35, that is provided in the command control circuit 21.

In FIG. 35, reference numeral 101 denotes a NOR circuit which subjects the erase verify fail signal EVFAIL and the erase verify pass signal EVPASS to a NOR process, and 102 denotes a NAND circuit which subjects the erase stop signal ERSTOP and the verify control signal VER to a NAND process.

Reference numerals 103 and 104 denote NAND circuits constituting an RS flip-flop circuit, and wherein an input terminal of the NAND circuit 103 receiving the output signal from the NOR circuit 101 can be regarded as a set input terminal, and an input terminal of the NAND circuit 104 receiving the output signal from the NAND circuit 102 can be regarded as a reset input terminal.

Reference numeral 105 denotes an inverter for inverting the output of the NAND circuit 103, and 106 denotes an inverter for inverting the output of the NAND circuit 104, the inverter 106 corresponding to the inverter 105 to maintain a balance.

Reference numeral 107 denotes an enhancement-type pMOS transistor which is turned on and off by the verify control signal VER, and 108 denotes an enhancement-type nMOS transistor which is turned on and off by an inverted verify control signal/VER that is obtained by inverting the verify control signal VER.

FIG. 36 and FIGS. 37 to 39 are a waveform diagram and circuit diagrams for explaining the operation of the erase verify control signal-forming circuit.

Figure 37:
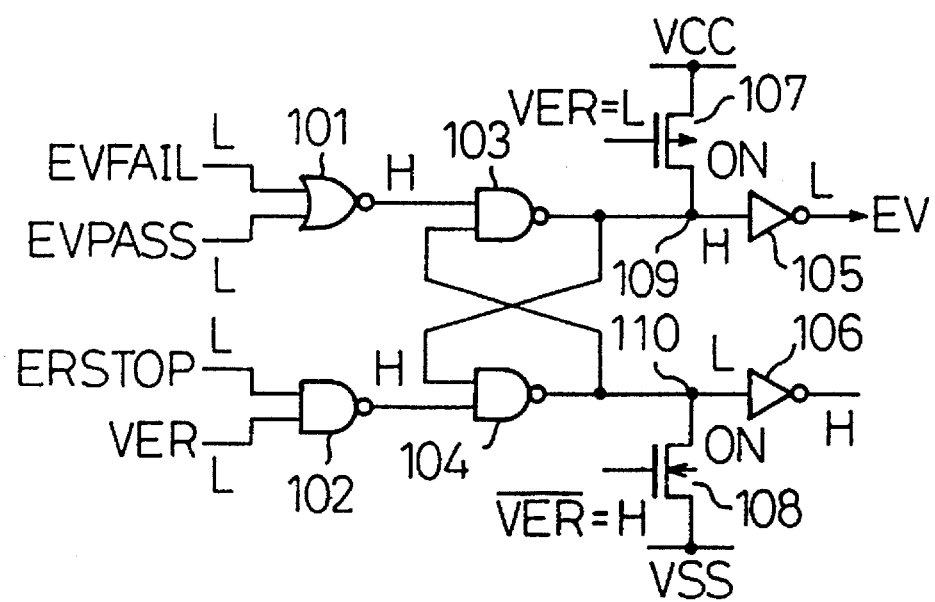
FIG. 37 is a diagram illustrating the operation of the erase verify control signal (EV)-forming circuit employed in the first embodiment of the present invention.

When the verify control signal VER is at the L level and the inverted verify control signal/VER is at the H level in the erase verify control signal-forming circuit as shown in FIG. 37, the pMOS transistor 107 is turned on, the nMOS transistor 108 is turned on, and the node 109 is fixed at the H level, the node 110 is fixed at the L level, and the erase verify control signal EV is fixed at the L level.

In this case, when the erase verify fail signal EVFAIL is at the L level, the erase verify pass signal EVPASS is at the L level and erase stop signal ERSTOP is at the L level, then, the output of NOR circuit 101 assumes the H level and the output of NAND circuit 102 assumes the H level.

Figure 38:
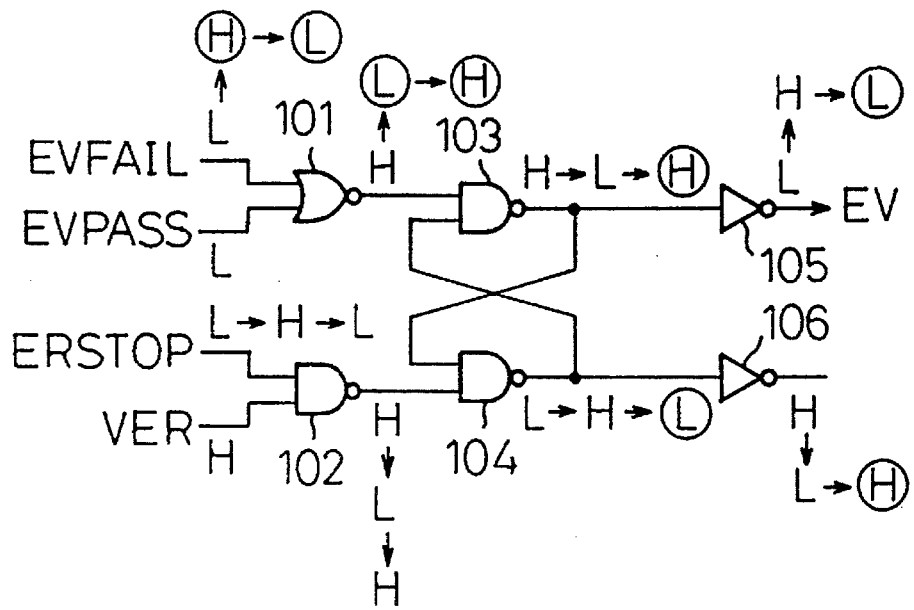
FIG. 38 is a diagram illustrating the operation of the erase verify control signal (EV)-forming circuit employed in the first embodiment of the present invention.

When the verify control signal VER assumes the H level and the inverted verify control signal/VER assumes the L level in this state, the pMOS transistor 107 is turned off and the nMOS transistor 108 is turned off, whereby the erase verify control signal-forming circuit becomes, equivalently, as shown in FIG. 38.

In this case, when the erase verify fail signal EVFAIL is at the L level, the erase verify pass signal EVPASS is at the L level and erase stop signal ERSTOP is at the L level, then, the output of the NOR circuit 101 is maintained at the H level and the output of the NAND circuit 102 is maintained at the H level.

Accordingly, the output of NAND circuit 103 is maintained at the H level, the output of NAND circuit 104 is maintained at the L level, and the erase verify control signal EV is maintained at the L level.

When the erase stop signal ERSTOP assumes the H level in this state, the output of NAND circuit 102 assumes the L level, the output of NAND circuit 104 assumes the H level, the output of NAND circuit 103 assumes the L level and the erase verify control signal EV assumes the H level.

Then, as the erase stop signal ERSTOP assumes the L level, the output of NAND circuit 102 assumes the H level. However, since the output of NAND circuit 103 is at the L level, the output of NAND circuit 104 is maintained at the H level.

When the erase verify fail signal EVFAIL assumes the H level in this state, the output of NOR circuit 101 assumes the L level, the output of NAND circuit 103 assumes the H level, the output of NAND circuit 104 assumes the L level and the erase verify control signal EV assumes the L level.

Then, as the erase verify fail signal EVFAIL assumes the L level, the output of NOR circuit 101 assumes the H level. However, since the output of NAND circuit 104 is at the L level, the output of NAND circuit 103 is maintained at the H level and the erase verify control signal EV is maintained at the L level.

Figure 39:
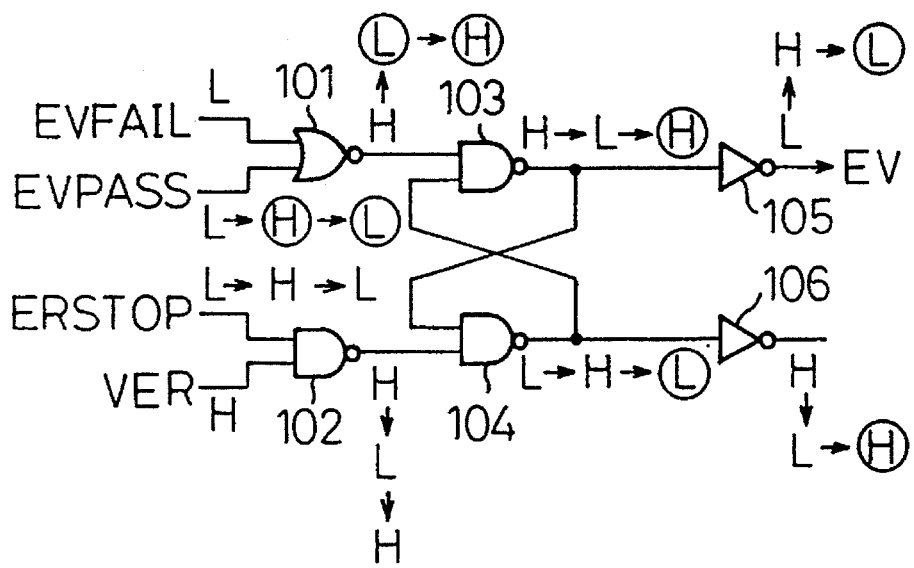
FIG. 39 is a diagram illustrating the operation of the erase verify control signal (EV)-forming circuit employed in the first embodiment of the present invention.

Next, when the erase stop signal ERSTOP assumes the H level, in the state shown in FIG. 39, the output of the NAND circuit 102 assumes the L level, the output of NAND circuit 104 assumes the H level, the output of NAND circuit 103 assumes the L level, and the erase verify control signal EV assumes the H level.

Then, as the erase stop signal ERSTOP assumes the L level, the output of NAND circuit 102 assumes the H level. However, since the output of NAND circuit 103 is at the L level, the output of NAND circuit 104 is maintained at the H level.

When the erase verify pass signal EVPASS assumes the H level, in this state, the output of NOR circuit 101 assumes the L level, the output of NAND circuit 103 assumes the H level, the output of NAND circuit 104 assumes the L level, and the erase verify control signal EV assumes the L level.

Next, when the erase verify pass signal EVPASS assumes the L level, in this state, the output of NOR circuit 101 assumes the H level. However, since the output of NAND circuit 104 is at the L level, the output of NAND circuit 103 is maintained at the H level and the erase verify control signal EV is maintained at the L level.

Figure 40:
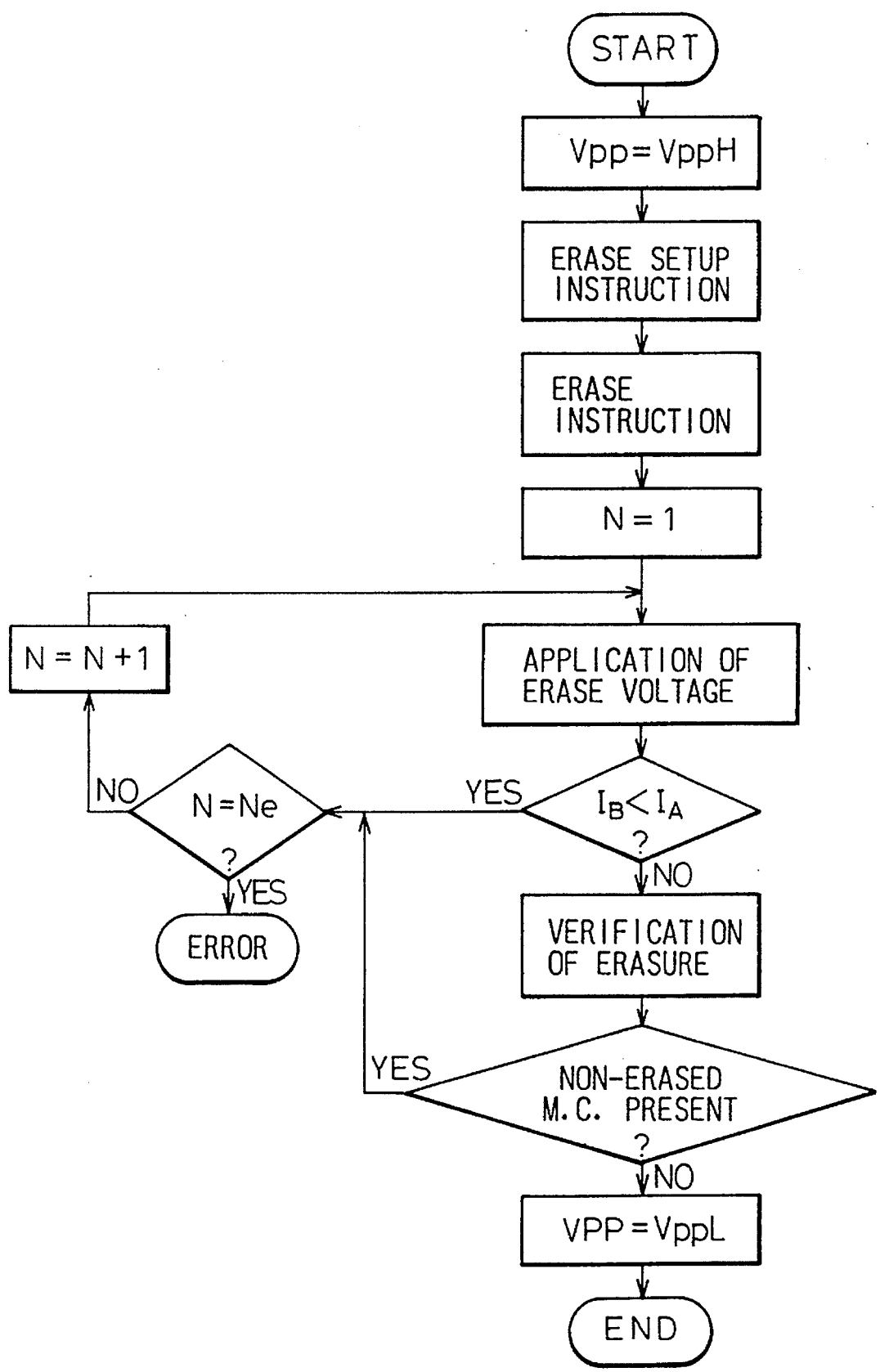
FIG. 40 is a flow chart illustrating the erasing procedure according to the first embodiment of the present invention.

According to the first embodiment, having the structual arrangements as described above, erasing is effected according to a procedure shown in FIG. 40.

That is, a VPPH=12.0 [V] is applied to the VPP terminal which is one of the external terminals.

Next, an erase setup instruction and an erase instruction are input consecutively, and the counted value N of the loop counter is set to N=1. Thereafter, an erase voltage is applied to the source of a memory for, for example, 10 ms to effect the erasing for a first time.

In this case, when an erase current $I_A$ flowing into the source of the memory cell is larger than a reference current $I_B$ flowing into the pMOS transistor 36 and nMOS transistors 38, 39 of the erase current monitoring circuit 33 shown in FIG. 2, i.e., when it is judged that there is no need to verify the erasure, the erasure is not verified and the counted value N of the loop counter is increased to be N=N+1 within a range of not exceeding, for example, 3000 times, and the erase voltage is repetitively applied to the source of the memory cell.

When the erase current $I_A$ that flows into the source of the memory cell becomes smaller than the reference current $I_B$ that flows into the pMOS transistor 36 and nMOS transistors 38, 39 in the erase current monitoring circuit 33, i.e., when it becomes necessary to verify erasure, the erasure is verified after the erase voltage is applied to the source of the memory cell.

When there non-erased memory cells are found as a result of verifying the erasure, the counted value N of the loop counter is increased to N=N+1 within a range which does not exceed a maximum count value Ne, and the application of an erase pulse, and verification of the erasure, are repeated.

In the case where non-erased memory cells are found as a result of verifying the erasure, when the counted value N of the loop counter comes into agreement with a maximum counted value Ne, error processing is executed.

On the other hand, when no non-erased memory cells are found as a result of verifying the erasure, the voltage at the terminal VPP is set to be, for example, VPPL=0 to 0.65 [V] and the erase mode is finished.

Figure 41:
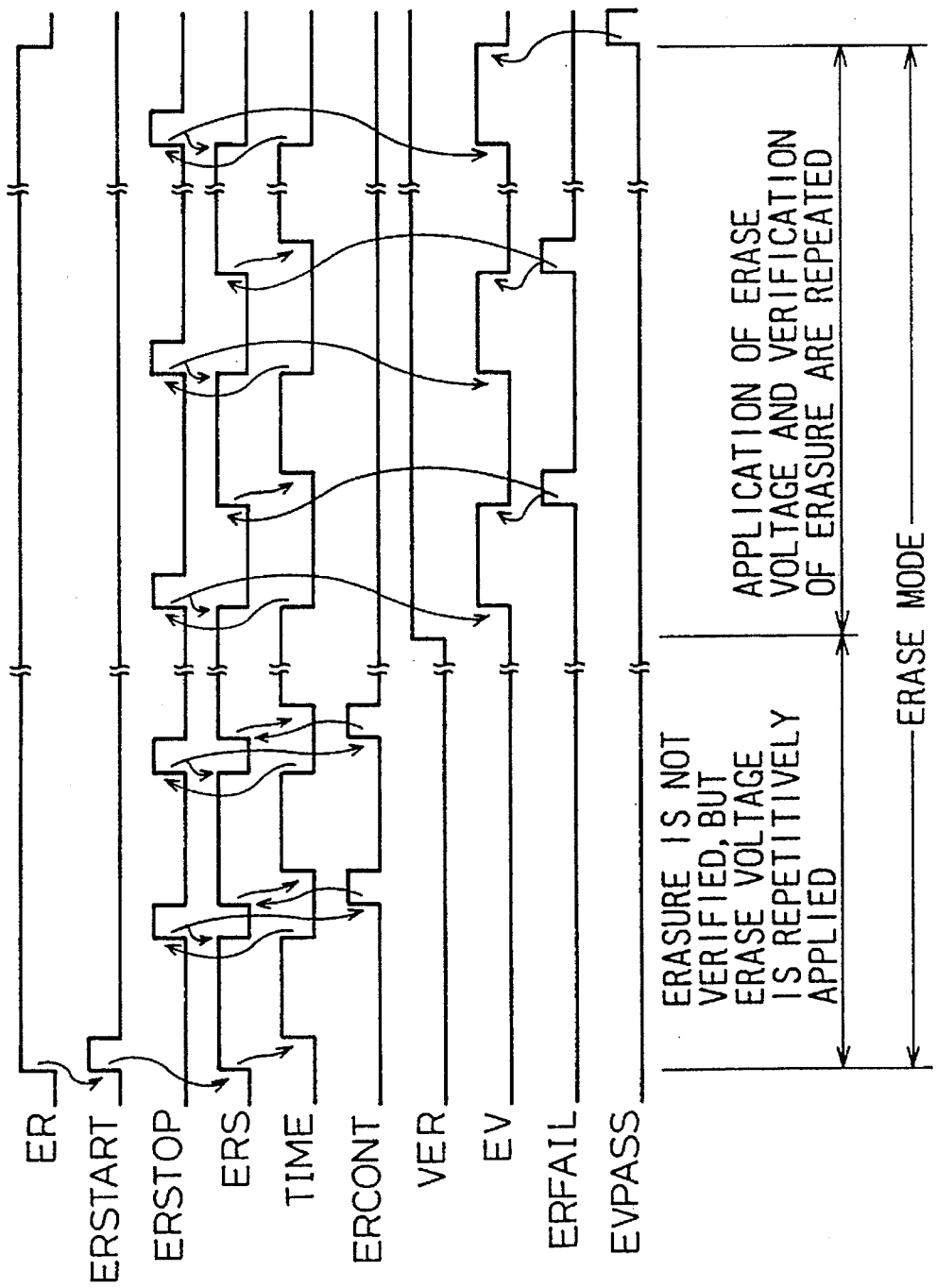
FIG. 41 is a diagram of waveforms illustrating the erase operation according to the first embodiment of the present invention.

FIG. 41 is a diagram of waveforms illustrating the erase operation according to the first embodiment wherein when an erase setup instruction and an erase instruction are consecutively input as commands, the command control circuit 21 outputs the erase signal ER at the H level to set the erase mode.

As a result, the erase start signal-forming circuit shown in FIG. 20 outputs the erase start signal ERSTART at the H level as shown in FIGS. 21 to 23 and feeds it to the erase control signal-forming circuit shown in FIG. 15.

Figure 16:
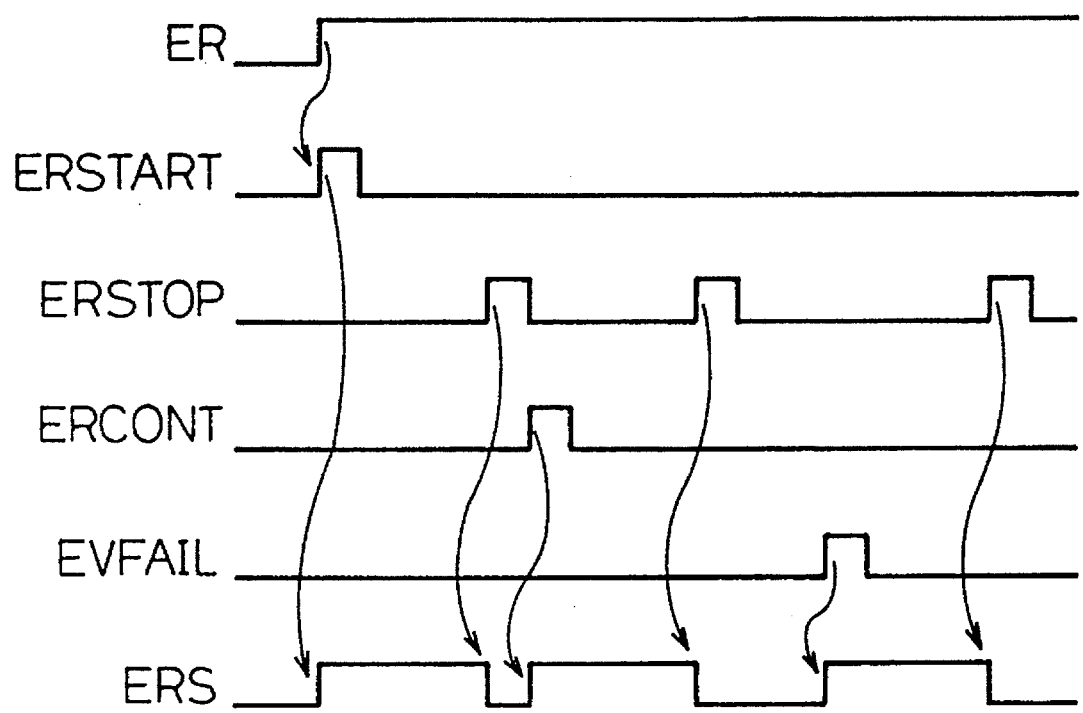
FIG. 16 is a diagram illustrating the operation of the erase control signal (ERS)-forming circuit employed in the first embodiment of the present invention.

In response thereto, the erase control signal-forming circuit shown in FIG. 15 outputs the erase control signal ERS at the H level as shown in FIGS. 16 and 17, and feeds it to the source power supply circuit 25 shown in FIG. 2.

The source power supply circuit 25 shown in FIG. 2 then renders the nMOS transistor 30 turned on as shown in FIG. 4, so that the erase voltage is applied to the source of the memory cell.

As the erase control signal-forming circuit outputs the erase control signal ERS at the H level, the erase time signal-forming circuit shown in FIG. 27 outputs the erase time signal TIME at the H level as shown in FIGS. 28 and 29 and, then, outputs the erase time signal TIME at the L level after a predetermined period of time has passed.

Thus, as the erase time signal TIME changes from the H level into the L level, the erase stop signal-forming circuit shown in FIG. 24 outputs the erase stop signal ERSTOP at the H level as shown in FIGS. 25 and 26.

When the erase stop signal ERSTOP assumes the H level, the erase control signal-forming circuit shown in FIG. 15 outputs the erase control signal ERS at the L level as shown in FIGS. 16 and 17.

Then, the source power supply circuit 25 shown in FIG. 2 renders the nMOS transistor 30 turned off as shown in FIG. 3, so that the application of erase voltage to the source of the memory cell is interrupted.

Figure 31:
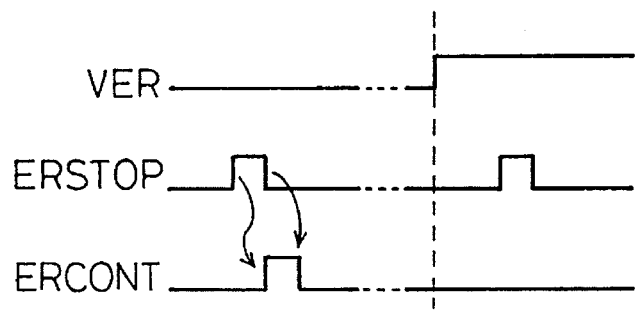
FIG. 31 is a diagram illustrating the operation of the erase-control-signal-rise-control signal (ERCONT)-forming circuit employed in the first embodiment of the present invention.

When the erase stop signal ERSTOP assumes the H level, the erase-control-signal-rise-control signal-forming circuit, shown in FIG. 30, outputs the erase-control-signal-rise-control signal ERCONT which is obtained by delaying the erase stop signal ERSTOP as shown in FIGS. 31 and 32.

Accordingly, the erase control signal-forming circuit shown in FIG. 15 outputs the erase control signal ERS of the H level as shown in FIGS. 16 and 18, and the source power supply circuit 25 shown in FIG. 2 renders the nMOS transistor 30 turned on as shown in FIG. 4, so that the erase voltage is applied to the source of the memory cell.

Then, when the erase stop signal ERSTOP assumes the H level, the erase control signal-forming circuit shown in FIG. 15 outputs the erase control signal ERS at the L level as shown in FIGS. 16 and 17.

The source power supply circuit 25 shown in FIG. 2 then renders the nMOS transistor 30 turned off as shown in FIG. 3, whereby the application of erase voltage to the source of the memory cell is interrupted.

Then, as far as the erase current $I_A$ flowing into the source of the memory cell is larger than the reference current $I_B$, i.e., as far as the verify control signal VER assumes the L level, the erase voltage is repetitively applied to the source of the memory cell being controlled by the erase-control-signal-rise-control signal ERCONT and the erase stop signal ERSTOP.

When the erase current $I_A$ flowing into the source of the memory cell becomes smaller than the reference current $I_B$, a verify control signal VER at the H level is output from the erase current monitoring circuit 33 of the source power supply circuit 25 shown in FIG. 2.

As a result, the erase verify control signal-forming circuit, shown in FIG. 35, is activated, and the state is shifted to the mode of verifying the erasure after the erase voltage is applied to the source of the memory cell.

Figure 36:
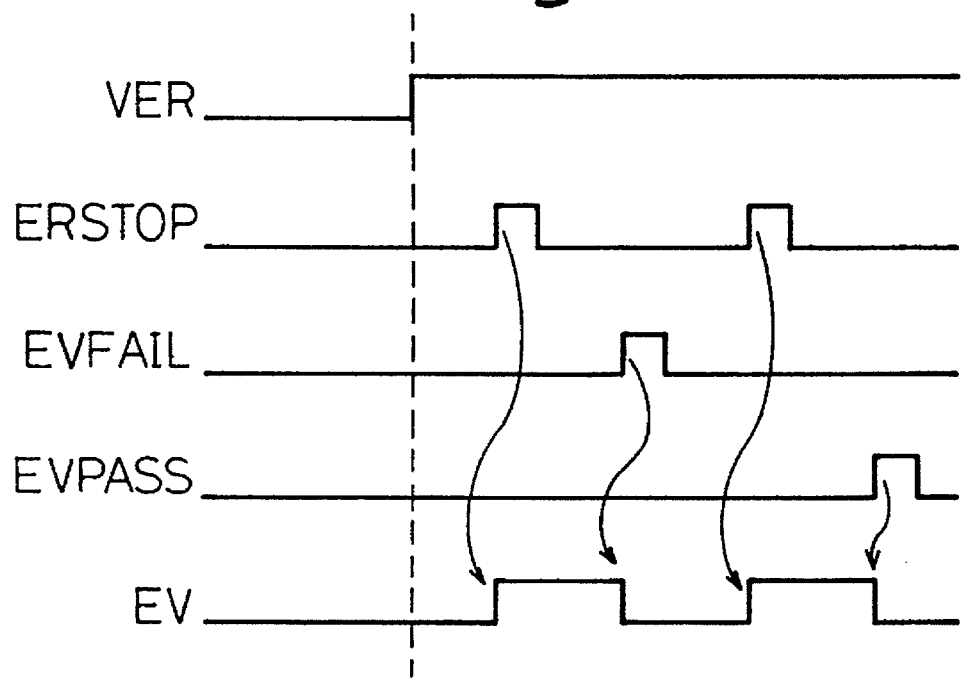
FIG. 36 is a diagram illustrating the operation of the erase verify control signal (EV)-forming circuit employed in the first embodiment of the present invention.

In this mode, the erase control signal ERS assumes the H level, the source power supply circuit 25 shown in FIG. 2 renders the nMOS transistor 30 turned on as shown in FIG. 4, so that the erase voltage is applied to the source of the memory cell. Then, as the erase stop signal ERSTOP assumes the H level, the erase verify control signal-forming circuit shown in FIG. 35 outputs the erase verify control signal EV at the H level as shown in FIGS. 36 to 38, whereby the erasure is verified under control of the erase verify control circuit 99 shown in FIG. 34.

When the presence of non-erased memory cells is confirmed as a result of verifying the erasure, the erase verify fail signal EVFAIL assumes the H level, and the erase control signal-forming circuit shown in FIG. 15 outputs an erase control signal ERS at the H level as shown in FIGS. 16 and 19.

Then, the source power supply circuit 25 shown in FIG. 2 renders the nMOS transistor 30 turned on as shown in FIG. 4, so that the erase voltage is applied to the source of the memory cell.

When the erase control signal-forming circuit produces an erase control signal ERS at the H level, the erase time signal-forming circuit shown in FIG. 27 outputs an erase time signal TIME at the H level as shown in FIGS. 28 and 29 and then outputs an erase time signal TIME at the L level after a predetermined period of time has passed.

As the erase time signal TIME changes from the H level to the L level, the erase stop signal-forming circuit shown in FIG. 24 outputs an erase stop signal ERSTOP at the H level as shown in FIGS. 25 and 26.

As the erase stop signal ERSTOP assumes the H level, the erase control signal-forming circuit shown in FIG. 15 outputs an erase control signal ERS at the L level as shown in FIGS. 16 and 17.

As a result, the source power supply circuit 25 shown in FIG. 2 renders the NMOS transistor 30 turned off as shown in FIG. 3, so that the application of the erase voltage to the source of the memory cell is interrupted.

Thereafter, the application of erase voltage to the source of the memory cell and the verification of erasure are repeated within a range until the number of times of applying the erase pulse reaches a predetermined number of times before the erase verify pass signal EVPASS assumes the H level.

When the erase verify pass signal EVPASS assumes the H level, the erase verify control signal-forming circuit shown in FIG. 35 outputs an erase verify control signal EV of the L level as shown in FIGS. 36 and 39, whereby the erase verification is ended and the erase mode is ended, too.

According to the first embodiment as described above, the erase verification is not effected in the erase mode until it is so judged that the erase current $I_A$ flowing into the source of the memory cell becomes smaller than the reference current $I_B$ but the erase voltage is repetitively applied to the source of the memory cell. When it is judged that the erase current $I_A$ flowing into the source of the memory cell is smaller than the reference current $I_B$ the application of erase pulse to the source of the memory cell and the erase verification are repeated. Thus, the number of times of erase verification is decreased and the time required for the erasing is shortened.

Figure 42:
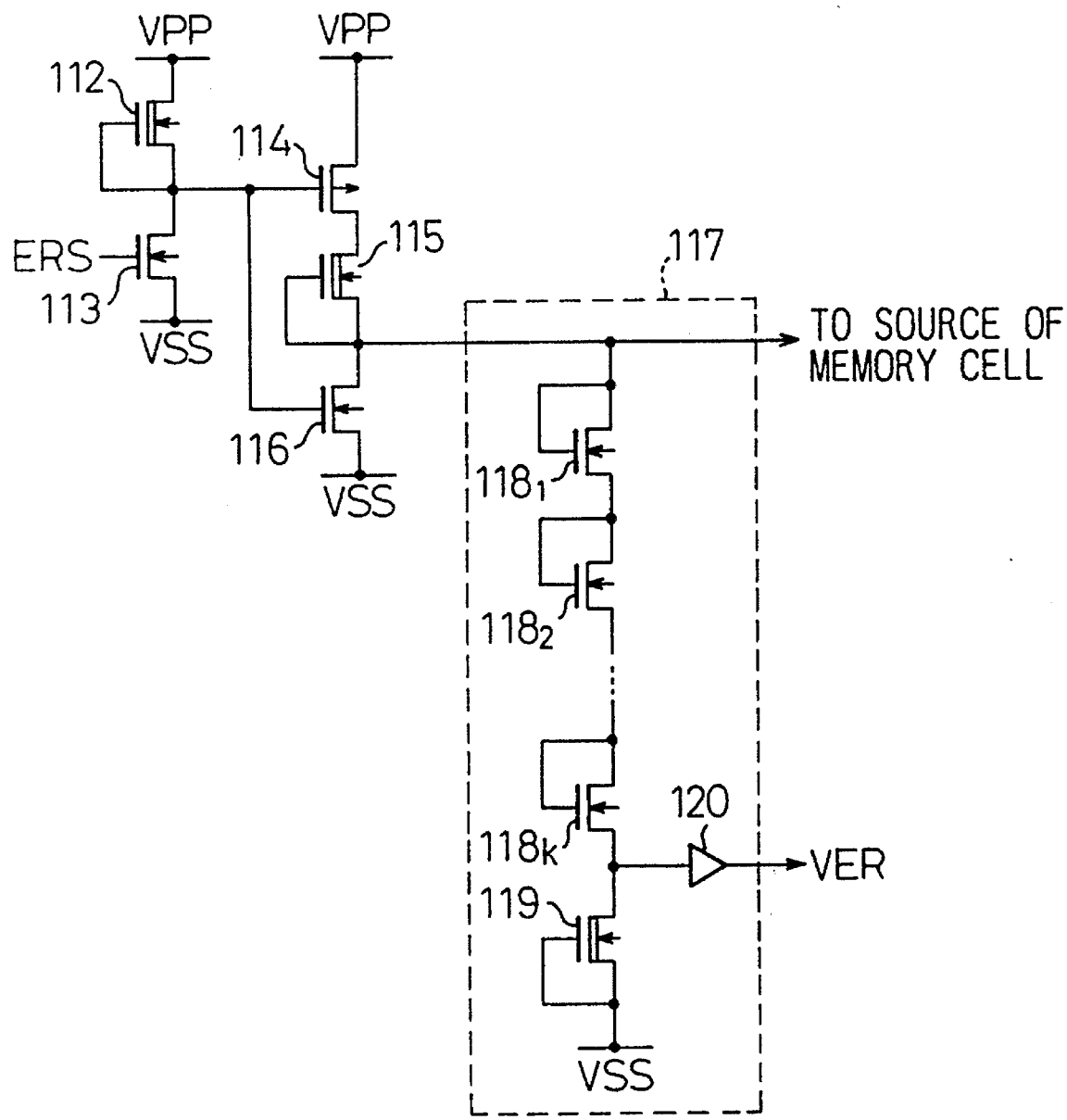
FIG. 42 is a diagram illustrating a source power supply circuit employed in a second embodiment of the present invention.
Figure 43:
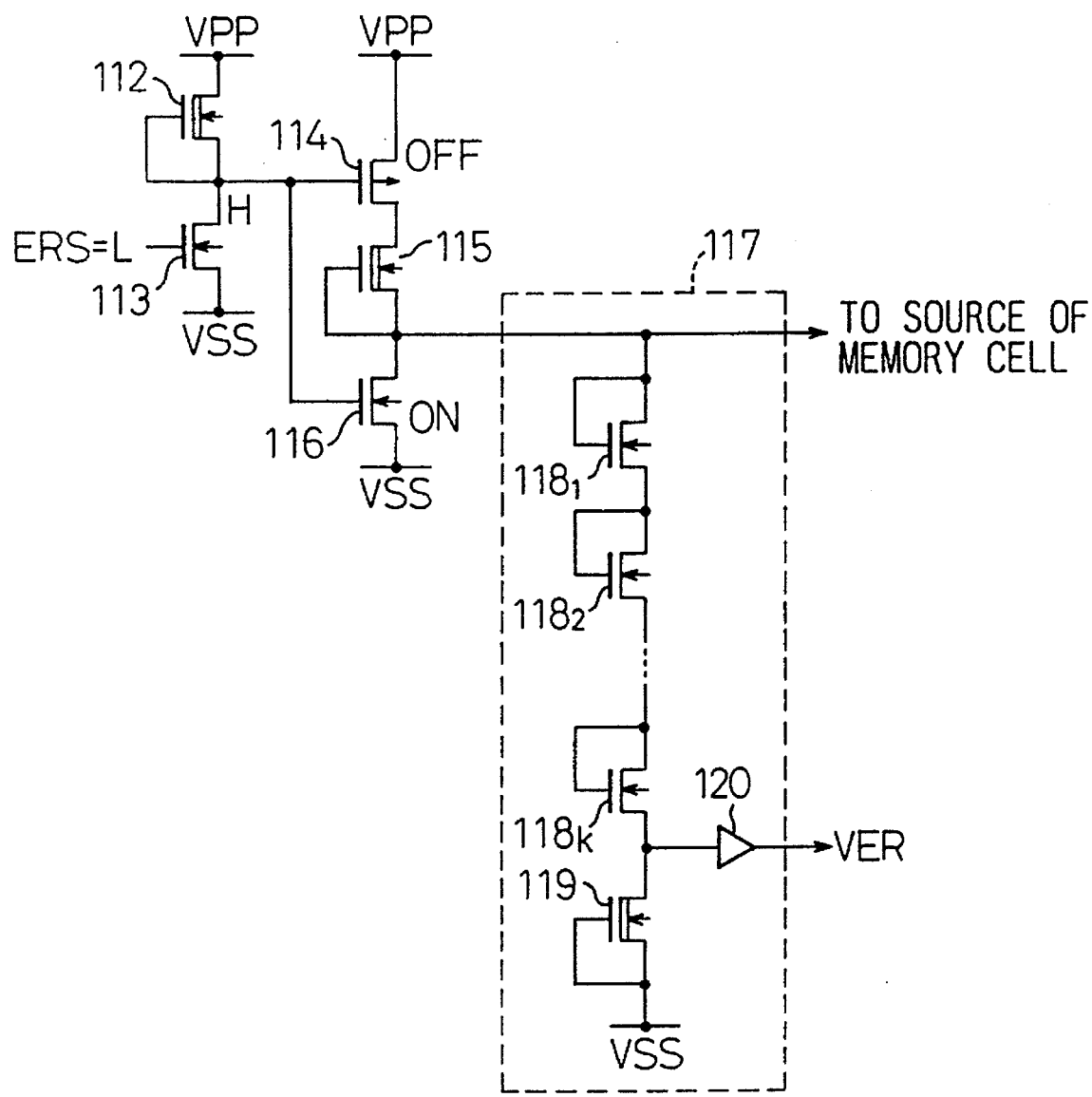
FIG. 43 is a diagram illustrating the operation of the source power supply circuit employed in the second embodiment of the present invention.
Figure 44:
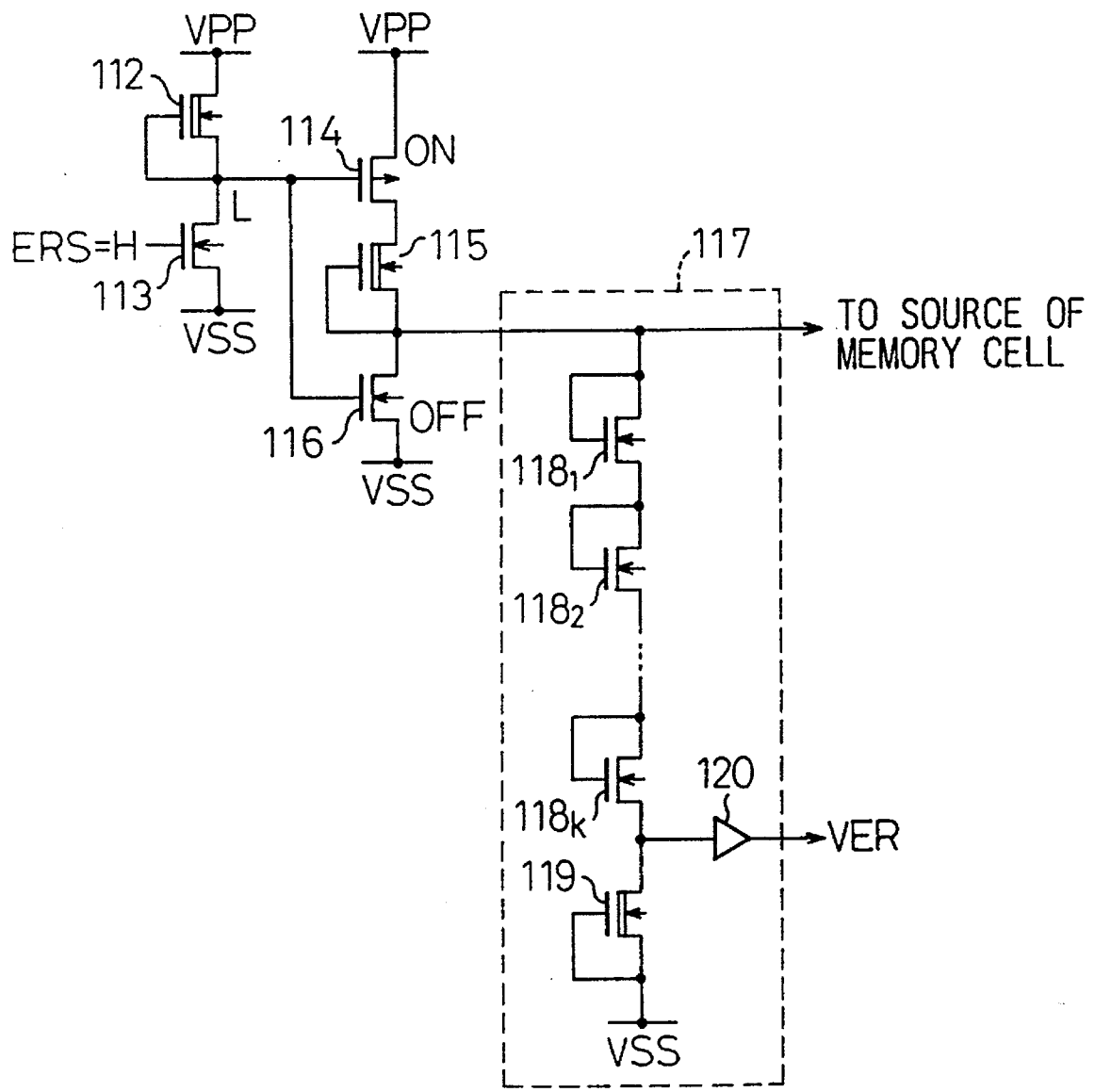
FIG. 44 is a diagram illustrating the operation of the source power supply circuit employed in the second embodiment of the present invention.

Second Embodiment—FIGS. 42 to 44

FIG. 42 is a circuit diagram illustrating major portions according to a second embodiment of the present invention, and shows a source power supply circuit employed in the second embodiment.

In the second embodiment of the present invention, the source power supply circuit shown in FIG. 42 is provided instead of the source power supply circuit employed in the first embodiment of the invention shown in FIG. 2. In other respects, the second embodiment is the same as the first embodiment shown in FIG. 1.

In FIG. 42, reference numeral 112 denotes a depletion-type nMOS transistor which works as a load element, and 113 denotes an enhancement-type nMOS transistor which is turned on and off by the erase control signal ERS.

Reference numeral 114 denotes an enhancement-type pMOS transistor which is turned on and off by the drain voltage of the nMOS transistor 113, reference numeral 115 denotes a depletion-type nMOS transistor which limits a maximum value of the erase voltage applied to the source of the memory cell, and 116 denotes an enhancement-type nMOS transistor which is turned on and off by the drain voltage of the nMOS transistor 113.

Reference numeral 117 denotes an erase voltage monitoring circuit which, in the erase mode, monitors the erase voltage applied to the source of the memory cell to judge whether the erase voltage applied to the source of the memory cell is larger than a predetermined value or not.

In the erase voltage monitoring circuit 117, reference numerals $118_1$ to $118_k$ (k is an integer of 2 or larger, $118_3$ to $118_{k-1}$ are not diagramed) denote diode-connected nMOS transistors of the enhancement type, 119 denotes a depletion-type nMOS transistor that serves as a load element, and reference numeral 120 denotes a buffer for outputting a verify control signal VER.

In cases other than when the erase voltage is applied to the source of the memory cell as shown in FIG. 43, the erase control signal ERS assumes the L level and the nMOS transistor 113 is turned off.

As a result, the drain voltage of nMOS transistor 113 assumes the H level (VPP), the pMOS transistor 114 is turned off, nMOS transistor 116 is turned on, and the power supply voltage VSS=0 [V] is applied to the source of the memory cell.

On the other hand, when the erase voltage is applied to the source of the memory cell as shown in FIG. 44, the erase control signal ERS assumes the H level and the nMOS transistor 113 is turned on.

Accordingly, the pMOS transistor 114 is turned on, the nMOS transistor 116 is turned off, and the erase voltage VPP is applied to the source of the memory cell via pMOS transistor 114 and nMOS transistor 115.

As described earlier, FIG. 5 is a diagram illustrating erase current vs. erase voltage characteristics of a memory cell and an operation curve of an erase voltage application circuit, wherein the abscissa represents the erase voltage applied to the source of the memory cell and the ordinate represents the erase current that flows into the source of the memory cell.

That is, even when VPPH=12 [V] is applied as a power supply voltage VPP to the VPP power supply line of the source power supply circuit shown in FIG. 42 in a state where the floating gate (FG) is assuming a negative voltage, e.g., −4 [V], the erase current is so large that the erase voltage applied to the source of the memory cell becomes 8.7 [V].

The erase current decreases as the voltage at the floating gate approaches 0 [V], i.e., as the erase state is assumed. Therefore, the erase voltage applied to the source of the memory cell approaches 12 [V].

According to the second embodiment, therefore, the nMOS transistors $118_1$ to $118_k$ are maintained turned off and a verify control signal VER of the L level is output when the erase voltage applied to the source of the memory cell is smaller than 10.5 [V], i.e., when the voltage at the floating gate is not higher than −2 [V], and the nMOS transistors $118_1$ to $118_k$ are turned on and a verify control signal VER of the H level is output when the erase voltage applied to the source of the memory cell becomes not smaller than 10.5 [V], i.e., when the voltage at the floating gate is not lower than −1 [V].

In the source power supply circuit, therefore, the erase voltage applied to the source of the memory cell is lower than 10.5 [V] until the voltage at the floating gate becomes −2 [V] after the erasing is started.

In this case, therefore, the nMOS transistors 118 to $118_k$ are maintained turned off, and a verify control signal VER of the L level is output and is latched by the command control circuit 21.

Accordingly, in such a case as described with respect to the first embodiment, the erase verification is not effected and the erase voltage is repetitively applied to the source of the memory cell.

Then, when the voltage at the floating gate rises to −2 [V] or higher, the erase voltage applied to the source of the memory cell becomes larger than 10.5 [V].

Then, the nMOS transistors $118_1$ to $118_k$ are turned on, and a verify control signal VER of the H level is output and is latched by the command control circuit 21.

In this case as described in the first embodiment, the erase verification is effected after the erase voltage is applied to the source of the memory cell.

According to the second embodiment as described above, the erase verification is not effected in the erase mode but the erase voltage is repetitively applied to the source of the memory cell until it is so judged that the erase voltage applied to the source of the memory cell is not smaller than, for example, 10.5 [V]. When it is judged that the erase voltage applied to the source of the memory cell is not smaller than, for example, 10.5 [V], the application of erase pulse to the source of the memory cell and the erase verification are repeated. Thus, the number of times of erase verification is decreased and the time required for the erasing is shortened.

While the invention has been particularly shown and described in reference to preferred embodiments thereof, it will be understood by those skilled in the art that changes in form and details may be made therein without departing from the spirit and scope of the invention.

What is claimed is:

1. A flash memory device, comprising:

a control circuit which controls an erase operation and an erase verify operation;

said control circuit, in an erase mode, not carrying out the erase verification but repetitively applying an erase voltage to a source of each memory cell until the erasing proceeds to a predetermined extent, said control circuit, after the erasing has proceeded to the predetermined extent, repetitively carrying out an application of said erase voltage to the source of each memory cell and said erase verification; and a verify control signal-forming circuit which, in said erase mode, monitors whether or not the erasing has proceeded to the predetermined extent, and after applying said erase voltage to the source of said memory cell, forms a verify control signal for controlling whether or not said erase verify operation is to be carried out, wherein said verify control signal-forming circuit comprises an erase current monitoring circuit for monitoring an erase current that flows into the source of said memory cell when said erase voltage is applied to said source, and wherein when said erase current exceeds a predetermined value, said verify control signal-forming circuit outputs said verify control signal at the inactive level, and when said erase current is below said predetermined value, said verify control signal-forming circuit outputs said verify control signal at the active level.

2. The flash memory device according to claim 1, wherein said control circuit comprises:

an erase verify control circuit for controlling said erase verify operation;

an erase verify control signal-forming circuit which, based on said verify control signal, forms an erase verify control signal for controlling an active state or an inactive state of said erase verify control circuit, and wherein when said verify control signal is at the inactive level, said control circuit brings said erase verify control circuit to the inactive state and applies said erase voltage to the source of said memory cell, to thereby prohibit said erase verify operation, and when said verify control signal is at the active level, said control circuit brings said erase verify control circuit to the active state and applies said erase voltage to the source of said memory cell, to thereby carry out said erase verify operation.

3. The flash memory device according to claim 2, wherein said verify control signal-forming circuit comprises:

a first field-effect transistor whose first to-be-controlled electrode is connected to an erase voltage line that supplies said erase voltage, and whose second to-be-controlled electrode is connected to a path that supplies said erase current;

a second field-effect transistor whose first to-be-controlled electrode is connected to said erase voltage line and which constitutes a first current mirror circuit using said first field-effect transistor as an input circuit;

a reference current circuit having a third field-effect transistor whose first to-be-controlled electrode is connected to said erase voltage line, said reference current circuit providing a reference current;

a fourth field-effect transistor whose first to-be-controlled electrode is connected to said erase voltage line and which constitutes a second current mirror circuit using said third field-effect transistor as an input circuit;

a fifth field-effect transistor whose first to-be-controlled electrode is connected to a second to-be-controlled electrode of said second field-effect transistor, and whose second to-be-controlled electrode is grounded;

a sixth field-effect transistor whose first to-be-controlled electrode is connected to a second to-be-controlled electrode of said fourth field-effect transistor, whose second to-be-controlled electrode is grounded, and which constitutes a third current mirror circuit using said fifth field-effect transistor as an input circuit; and a buffer circuit whose input end is connected to the first to-be-controlled electrode of said fifth field-effect transistor and which outputs said verify control signal at an output end thereof, and wherein when said erase current exceeds said reference current, said verify control signal-forming circuit outputs said verify control signal at the inactive level, and when said erase current is equal to or below said reference current, said verify control signal-forming circuit outputs said verify control signal at the active level.

4. The flash memory device according to claim 2, wherein said verify control signal-forming circuit comprises an erase voltage monitoring circuit for monitoring an erase voltage that is applied to the source of said memory cell when said erase voltage is applied to said source, and wherein when said erase voltage is below a predetermined value, said verify control signal-forming circuit outputs said verify control signal at the inactive level, and when said erase voltage exceeds said predetermined value, said verify control signal-forming circuit outputs said verify control signal at the active level.

5. The flash memory device according to claim 2, wherein said verify control signal-forming circuit comprises:

a load element whose one end is grounded;

a plurality of one-directional elements connected in series in the forward direction between a source line for supplying said erase voltage and an other end of said load element; and a buffer circuit whose input end is connected to the other end of said load element and which outputs said verify control signal at an output end thereof, and wherein when a voltage at the other end of said load element is below a predetermined voltage value, said verify control signal-forming circuit outputs said verify control signal at the inactive level, and when the voltage at the other end of said load element exceeds said predetermined voltage value, said verify control signal-forming circuit outputs said verify control signal at the active level.

6. The flash memory device according to claim 2, wherein when said erase verify control circuit is activated by said erase verify control signal, it controls said erase verify operation and thus generates an erase verify fail signal indicating presence of non-erased memory cells, or an erase verify pass signal indicating absence of non-erased memory cells.

7. The flash memory device according to claim 6, wherein said erase verify control signal-forming circuit comprises:

a two-input NOR circuit which receives said erase verify fail signal at a first input end thereof and receives said erase verify pass signal at a second input end thereof;

an erase stop signal-forming circuit which forms an erase stop signal for interrupting application of the erase voltage to each memory cell;

a two-input NAND circuit which receives said erase stop signal at a first input end thereof and receives said verify control signal at a second input end thereof; and a flip-flop circuit which receives an output signal of said NOR circuit at a set input end thereof and receives an output signal of said NAND circuit at a reset input end thereof, and which outputs said erase verify control signal at an output end thereof.

8. The flash memory device according to claim 7, wherein said erase stop signal-forming circuit comprises:

an erase time signal-forming circuit which forms an erase time signal for restricting one application time of the erase voltage to each memory cell;

an inverting delay circuit which receives said erase time signal at an input end thereof; and a two-input NOR circuit which receives an output signal of said inverting delay circuit at a first input end thereof and receives said erase time signal at a second input end thereof, and which outputs said erase stop signal at an output end thereof.

9. The flash memory device according to claim 8, wherein said erase time signal-forming circuit comprises:

an erase control signal-forming circuit which forms an erase control signal for controlling the supply of the erase voltage to said memory cell;

a two-input NAND circuit which receives said erase control signal at a first input end thereof;

an inverting delay circuit which receives an output signal of said NAND circuit at an input end thereof, and which outputs said erase time signal at an output end thereof; and an inverting circuit whose input end is connected to the output end of said inverting delay circuit and whose output end is connected to a second input end of said NAND circuit.

10. The flash memory device according to claim 9, wherein said erase control signal-forming circuit comprises:

a first inverting circuit which receives said erase stop signal at an input end thereof;

a first three-input NAND circuit which receives an erase signal for setting the erase mode at a first input end thereof and receives an output signal of said first inverting circuit at a second input end thereof;

an erase start signal-forming circuit which forms an erase start signal for indicating a start of the erase mode operation;

an erase-control-signal-rise-control- signal-forming circuit which forms an erase-control- signal-rise-control-signal for starting the application of the erase voltage to said memory cell;

a three-input NOR circuit which receives said erase start signal at a first input end thereof, receives said erase-control-signal-rise-control-signal at a second input end thereof, and receives said erase verify fail signal at a third input end thereof;

a second two-input NAND circuit which receives an output signal of said first NAND circuit at a first input end thereof and receives an output signal of said NOR circuit at a second input end thereof, and whose output end is connected to a third input end of said first NAND circuit; and a second inverting circuit which receives the output signal of said first NAND circuit at an input end thereof, and which outputs said erase control signal at an output end thereof.

11. The flash memory device according to claim 10, wherein said erase start signal-forming circuit comprises:

an inverting delay circuit which receives said erase signal at an input end thereof;

a two-input NAND circuit which receives an output signal of said inverting delay circuit at a first input end thereof and receives said erase signal at a second input end thereof; and an inverting circuit which receives an output signal of said NAND circuit at an input end thereof, and which outputs said erase start signal at an output end thereof.

12. The flash memory device according to claim 10, wherein said erase-control-signal-rise-control-signal-forming circuit comprises:

an inverting circuit which receives said verify control signal at an input end thereof;

a two-input NAND circuit which receives an output signal of said inverting circuit at a first input end thereof and receives said erase stop signal at a second input end thereof; and an inverting delay circuit which receives an output signal of said NAND circuit at an input end thereof, and which outputs said erase-control-signal- rise-control-signal at an output end thereof.

13. A flash memory device, comprising:

a control circuit which controls an erase operation and an erase verify operation, said control circuit, in an erase mode, not carrying out the erase verification but repetitively applying an erase voltage to a source of each memory cell until the erasing proceeds to a predetermined extent, said control circuit, after the erasing has proceeded to the predetermined extent, repetitively carrying out an application of said erase voltage to the source of each memory cell and said erase verification, wherein the control circuit comprises:

an erase verify control circuit for controlling said erase verify operation, a verify control signal-forming circuit which, in said erase mode, monitors whether or not the erasing has proceeded to the predetermined extent, and after applying said erase voltage to the source of said memory cell, forms a verify control signal for controlling whether or not said erase verify operation is to be carried out, and an erase verify control signal-forming circuit which, based on said verify control signal, forms an erase verify control signal for controlling an active state or an inactive state of said erase verify control circuit, and wherein when said verify control signal is at the inactive level, said control circuit brings said erase verify control circuit to the inactive state and applies said erase voltage to the source of said memory cell, to thereby prohibit said erase verify operation, and when said verify control signal is at the active level, said control circuit brings said erase verify control circuit to the active state and applies said erase voltage to the source of said memory cell, to thereby carry out said erase verify operation, wherein said verify control signal-forming circuit comprises:

a first field-effect transistor whose first to-be-controlled electrode is connected to an erase voltage line that supplies said erase voltage, and whose second to-be-controlled electrode is connected to a path that supplies said erase current, a second field-effect transistor whose first to-be-controlled electrode is connected to said erase voltage line and which constitutes a first current mirror circuit using said first field effect transistor as an input circuit, a reference current circuit having a third field-effect transistor whose first to-be-controlled electrode is connected to said erase voltage line, said reference current circuit providing a reference current, a fourth field-effect transistor whose first to-be-controlled electrode is connected to said erase voltage line and which constitutes a second current mirror circuit using said third field-effect transistor as an input circuit, a fifth field-effect transistor whose first to-be-controlled electrode is connected to a second to-be-controlled electrode of said second field-effect transistor, and whose second to-be-controlled electrode is grounded, a sixth field-effect transistor whose first to-be-controlled electrode is connected to a second to-be-controlled electrode of said fourth field-effect transistor, whose second to-be-controlled electrode is grounded, and which constitutes a third current mirror circuit using said first field-effect transistor as an input circuit, and a buffer circuit whose input end is connected to the first to-be-controlled electrode of said fifth field-effect transistor and which outputs said verify control signal at an output end thereof, and wherein when said erase current exceeds said reference current, said verify control signal-forming circuit outputs said verify control signal at the inactive level, and when said erase current is equal to or below said reference current, said verify control signal-forming circuit outputs said verify control signal at the active level.

14. A flash memory device, comprising:

a control circuit which controls an erase operation and an erase verify operation, said control circuit, in an erase mode, not carrying out the erase verification but repetitively applying an erase voltage to a source of each memory cell until the erasing proceeds to a predetermined extent, said control circuit, after the erasing has proceeded to the predetermined extent, repetitively carrying out an application of said erase voltage to the source of each memory cell and said erase verification, wherein the control circuit comprises:

an erase verify control circuit for controlling said erase verify operation, a verify control signal-forming circuit which, in said erase mode, monitors whether or not the erasing has proceeded to the predetermined extent, and after applying said erase voltage to the source of said memory cell, forms a verify control signal for controlling whether or not said erase verify operation is to be carried out, and an erase verify control signal-forming circuit which, based on said verify control signal, forms an erase verify control signal for controlling an active state or an inactive state of said erase verify control circuit, and wherein when said verify control signal is at the inactive level, said control circuit brings said erase verify control circuit to the inactive state and applies said erase voltage to the source of said memory cell, to thereby prohibit said erase verify operation, and when said verify control signal is at the active level, said control circuit brings said erase verify control circuit to the active state and applies said erase voltage to the source of said memory cell, to thereby carry out said erase verify operation, wherein said verify control signal-forming circuit comprises:

a load element whose one end is grounded, a plurality of one-directional elements connected in series in the forward direction between a source line for supplying said erase voltage and an other end of said load element, and a buffer circuit whose input end is connected to the other end of said load element and which outputs said verify control signal at an output end thereof, and wherein when a voltage at the other end of said load element is below a predetermined voltage value, said verify control signal-forming circuit outputs said verify control signal at the inactive level, and when the voltage at the other end of said load element exceeds said predetermined voltage value, said verify control signal-forming circuit outputs said verify control signal at the active level.

15. A flash memory device, comprising:

a control circuit which controls an erase operation and an erase verify operation, said control circuit, in an erase mode, not carrying out the erase verification but repetitively applying an erase voltage to a source of each memory cell until the erasing proceeds to a predetermined extent, said control circuit, after the erasing has proceeded to the predetermined extent, repetitively carrying out an application of said erase voltage to the source of each memory cell and said erase verification, wherein the control circuit comprises:

an erase verify control circuit for controlling said erase verify operation, a verify control signal-forming circuit which, in said erase mode, monitors whether or not the erasing has proceeded to the predetermined extent, and after applying said erase voltage to the source of said memory cell, forms a verify control signal for controlling whether or not said erase verify operation is to be carried out, and an erase verify control signal-forming circuit which, based on said verify control signal, forms an erase verify control signal for controlling an active state or an inactive state of said erase verify control circuit, and wherein when said verify control signal is at the inactive level, said control circuit brings said erase verify control circuit to the inactive state and applies said erase voltage to the source of said memory cell, to thereby prohibit said erase verify operation, and when said verify control signal is at the active level, said control circuit brings said erase verify control circuit to the active state and applies said erase voltage to the source of said memory cell, to thereby carry out said erase verify operation, wherein when said erase verify control circuit is activated by said erase verify control circuit is activated by said erase verify control signal, it controls said erase verify operation and thus generates an erase verify fail signal indicating presence of non-erased memory cells, or an erase verify pass signal indicating absence of non-erased memory cells, wherein said erase verify control signal-forming circuit comprises:

a two-input NOR circuit which receives said erase verify fail signal at a first input end thereof and receives said erase verify pass signal at a second input end thereof, an erase stop signal-forming circuit which forms an erase stop signal for interrupting application of the erase voltage to each memory cell, a two-input NAND circuit which receives said erase stop signal at a first input end thereof and receives said verify control signal at a second input end thereof, and a flip-flop circuit which receives an output signal of said NOR circuit at a set input end thereof and receives an output signal of said NAND circuit at a reset input end thereof, and which outputs said erase verify control signal at an output end thereof.

* * * * *